(12) United States Patent
Roberto

(10) Patent No.: US 11,581,865 B2
(45) Date of Patent: Feb. 14, 2023

(54) AUDIO SYSTEM WITH COMPRESSOR SIDECHAIN FREQUENCY-BIASING FILTER FOR SWITCHED-MODE POWER SUPPLY OVERBOOST ENERGY UTILIZATION

(71) Applicant: Cirrus Logic International Semiconductor Ltd., Edinburgh (GB)

(72) Inventor: Miles Klett Roberto, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 137 days.

(21) Appl. No.: 17/323,551

(22) Filed: May 18, 2021

(65) Prior Publication Data
US 2022/0376668 A1   Nov. 24, 2022

(51) Int. Cl.
*H03G 9/02* (2006.01)
*H03G 7/00* (2006.01)
*H03F 1/02* (2006.01)
*H03F 3/217* (2006.01)

(52) U.S. Cl.
CPC .......... *H03G 9/025* (2013.01); *H03F 1/0227* (2013.01); *H03F 3/217* (2013.01); *H03G 7/007* (2013.01); *H03F 2200/03* (2013.01); *H03F 2200/105* (2013.01)

(58) Field of Classification Search
CPC ...... H03G 9/025; H03G 7/007; H03F 1/0227; H03F 3/217; H03F 2200/03; H03F 2200/105
See application file for complete search history.

(56) References Cited

U.S. PATENT DOCUMENTS

| | | |
|---|---|---|
| 6,765,436 B1 | 7/2004 | Melanson et al. |
| 9,614,489 B2 * | 4/2017 | Cheng .................... H03G 9/005 |
| 10,187,025 B1 | 1/2019 | May et al. |
| 10,231,050 B2 | 3/2019 | Serwy et al. |
| 10,243,524 B2 | 3/2019 | Orr |
| 10,581,391 B2 | 3/2020 | Orr |
| 10,917,053 B2 | 2/2021 | Orr |
| 2009/0287496 A1 * | 11/2009 | Thyssen ................ H03G 7/007  704/500 |
| 2012/0191462 A1 * | 7/2012 | Aoki ...................... H03G 7/007  704/500 |

(Continued)

*Primary Examiner* — David L Ton
(74) *Attorney, Agent, or Firm* — E. Alan Davis; Huffman Law Group, PC

(57) ABSTRACT

An audio system has an amplifier for driving an audio actuator and includes a switched-mode power supply that draws power from a power source (e.g., battery) to supply power to the amplifier, a capacitor charged by the switched-mode power supply to supply power to the amplifier, and a feed-forward compressor that performs dynamic range compression of an audio input to provide an audio output for amplification by the amplifier. The compressor includes a sidechain frequency-biasing filter that generates a frequency-biased version of the audio input that is attenuated as frequency increases which causes the compressor to decrease the compression as frequency increases. A control block limits current drawn from the battery by the switched-mode power supply independent of audio input frequency, but the frequency-biasing filter enables the amplifier to service audio power transients greater than the current-limited power supply can supply by advantageously concurrently sourcing extra power from the capacitor.

21 Claims, 20 Drawing Sheets

(56) References Cited

U.S. PATENT DOCUMENTS

| | | |
|---|---|---|
| 2015/0162885 A1 | 6/2015 | Lesso |
| 2018/0358945 A1* | 12/2018 | Lindemann ............ H03G 11/00 |
| 2020/0112787 A1 | 4/2020 | Chadha et al. |
| 2020/0235712 A1 | 7/2020 | May et al. |
| 2020/0336114 A1 | 10/2020 | Sahiti |
| 2021/0376796 A1* | 12/2021 | Millyard ................ H03F 3/183 |

* cited by examiner

AUDIO SYSTEM WITH COMPRESSOR SIDECHAIN FREQUENCY-BIASING FILTER FOR SWITCHED-MODE POWER SUPPLY OVERBOOST ENERGY UTILIZATION

BACKGROUND

There appears to be an ever-present demand for more loudness in audio systems, particularly in mobile audio devices. In some audio systems, such as portable audio devices or other embedded audio systems, the peak power that an audio amplifier may provide is constrained by amplifier design, input power budget, solution size, and other limitations. Hence, improved techniques for providing increased peak power to audio amplifiers are needed.

SUMMARY

In one embodiment, the present disclosure provides an audio system having an amplifier for driving an audio actuator. The audio system includes a switched-mode power supply that draws power from a power source to supply power to the amplifier, a capacitor that is charged by the switched-mode power supply to supply power to the amplifier, and a feed-forward compressor that performs dynamic range compression of an audio input to provide an audio output for amplification by the amplifier. The compressor includes a sidechain frequency-biasing filter that generates a frequency-biased version of the audio input that is attenuated as frequency increases which causes the compressor to decrease the compression as frequency increases.

In another embodiment, the present disclosure provides an audio device. The audio device includes an amplifier that drives an audio actuator, a switched-mode power supply that draws power from a power source to supply power to the amplifier, a capacitor that is charged by the switched-mode power supply to supply power to the amplifier, and a feed-forward compressor that performs dynamic range compression of an audio input to provide an audio output for amplification by the amplifier. The compressor includes a sidechain frequency-biasing filter that generates a frequency-biased version of the audio input that is attenuated as frequency increases which causes the compressor to decrease the compression as frequency increases.

In yet another embodiment, the present disclosure provides a method for use in an audio system having an amplifier for driving an audio actuator. The method includes drawing, by a switched-mode power supply, power from a power source to supply power to the amplifier. The method also includes charging, by the switched-mode power supply, a capacitor to supply power to the amplifier. The method also includes performing, by a feed-forward compressor, dynamic range compression of an audio input to provide an audio output for amplification by the amplifier. Performing the compression includes generating, by a sidechain frequency-biasing filter, a frequency-biased version of the audio input that is attenuated as frequency increases which causes the compressor to decrease the compression as frequency increases.

In one embodiment, a system uses Class H overboost output capacitor energy storage using a frequency-biasing filter, or frequency shaping filter, in the compressor sidechain power computation of an input current limited boosted amplifier system. The term "overboost" refers to increased voltage headroom above a target output, e.g., of a Class D amplifier. Class H refers to modulation of a supply voltage rail provided to the amplifier by a power supply as needed based on the input level. The bias filter in the power computation sidechain causes the energy stored on the overboost capacitors to be used by the amplifier to drive higher output peaks without clipping. In one embodiment, the system may be used in a manner to control analog output clipping in an input current restricted system. In one embodiment, the system employs frequency-biasing for micro speaker algorithms which use sidechain compressors. For example, the frequency-biasing filter may model the resonant frequency and inductive rise of the micro speaker impedance to generate a more accurate power computation.

DETAILED DESCRIPTION

Figure 1:
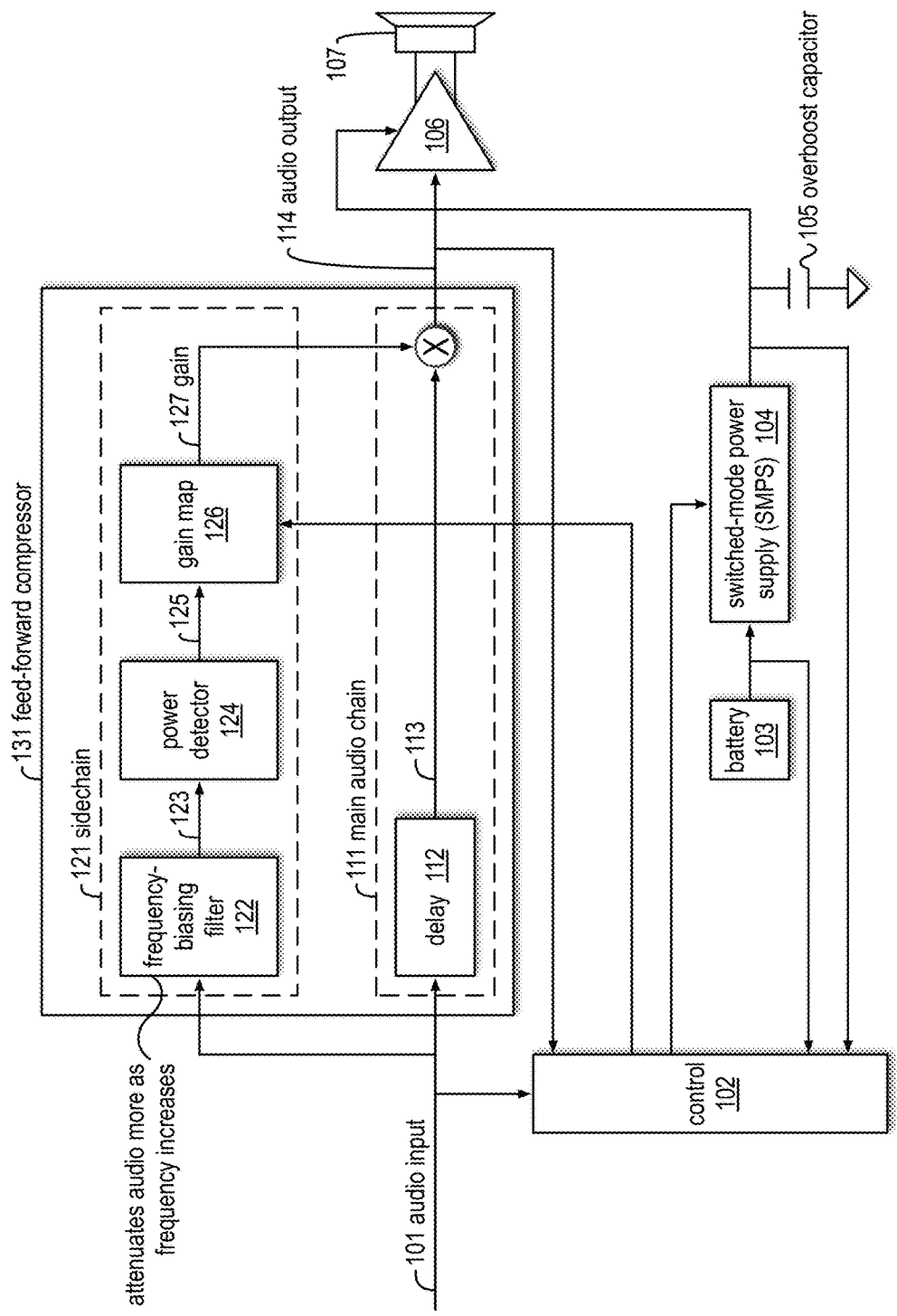
FIG. 1 is an example audio system in accordance with embodiments of the present disclosure.

The present inventors have observed that, all other things being equal, the energy stored on an overboost capacitor can be utilized to deliver peak audio power more effectively as the frequency of the audio input signal increases. This may be conceptualized as follows. Assume a generally sinusoidal audio input signal that represents a peak transient in an audio signal in this example. To avoid clipping the signal, the overboost energy is needed to power the amplifier output during peak portions of the input signal, i.e., during output levels at which the input power to the switched mode supply is maxed out or limited. During the non-peak portions of the input signal, the overboost capacitor may be recharged. The amount of energy drawn from the overboost capacitor during the peak portion is roughly a product of the power drawn and the time duration of the peak portion of the input signal. The peak time duration is inversely proportional to the frequency of the input signal. That is, the lower the frequency, the longer the peak duration; conversely, the higher the frequency, the shorter the peak duration. For example, the peak duration of a 50 Hz signal may be one hundred times longer than the peak duration of a 5 kHz signal. Thus, at lower frequencies, the likelihood is greater that the energy available in the overboost capacitor will be depleted and unable to provide the needed power to the amplifier output to avoid clipping for the full peak duration before the overboost capacitor can be recharged. This may be particularly true if the capacitor has a relatively small capacitance, e.g., in the case of an integrated circuit overboost capacitor. In contrast, at higher frequencies, the likelihood is greater that the energy stored in the overboost capacitor will be able to provide the needed power to the amplifier output for the full peak duration. Thus, the observation that the overboost capacitor energy can be more effectively utilized to avoid or reduce clipping by considering the frequency characterization of the audio input signal.

However, conventional dynamic range compressors do not consider the frequency-biased nature of the energy available in an overboost capacitor. Advantageously, embodiments are described herein that benefit from the observation described above by including a frequency-biasing filter in a compressor sidechain to provide a frequency-biased version of the audio input signal to the input power predictor. More specifically, the frequency-biasing filter causes the high frequency portion of the audio spectrum of the audio input signal to have lower gain than the low frequency portion of the audio spectrum. As a result, the power predictor provides a frequency-biased input power prediction to the compressor. That is, given two equal power input signals, the power predictor will produce a relatively lower power prediction for the higher frequency input signal than for the lower frequency input signal. As a result, the compressor controls the gain of the amplifier to use more power when the input signal is characterized by higher frequencies and to use less power when the input signal is characterized by lower frequencies, all other things being equal. In this manner, the amplifier is enabled to demand more power, afforded by the pre-charged overboost capacitor (e.g., pre-charged by the power supply when the audio output is demanding less power than the power supply can provide), to increase audio loudness when the frequency spectrum of the audio input signal is dominated by higher frequency, e.g., a rim shot or cymbal strike.

Furthermore, clipping a human-audible audio signal characterized by higher frequency may be much more acceptable than clipping a lower frequency audio signal. This is because the first harmonic (and higher harmonics) of the high frequency signal (e.g., 10 kHz or above) will appear outside the human-audible range, whereas clipping a low frequency audio signal may undesirably generate harmonics that are within the human-audible range. Advantageously, the inclusion of the frequency-biasing filter in the sidechain may provide the benefit of fully utilizing the overboost capacitor energy in the presence of a high frequency input signal, even if that induces some clipping at higher frequencies, by avoiding clipping in the presence of a low frequency input signal, thereby maintaining high fidelity while increasing the loudness of high frequency input signals afforded by the overboost capacitor energy.

FIG. 1 is an example audio system 100 in accordance with embodiments of the present disclosure. The audio system 100 may be included in any device that produces an audio output, which may include but is not limited to a portable audio device, such as a mobile telephone or personal audio device. The audio system 100 receives an audio input signal 101. The audio input signal 101 may be a playback signal, a voice signal (e.g., near end or far end telephone voice), or other audio signal. The audio input signal 101 may be a digital signal or an analog signal. The audio system 100 includes a feed-forward compressor 131 that receives the audio input signal 101 and processes it to generate an audio output signal 114. The audio output 114 is amplified by an amplifier 106 that drives an audio actuator 107, e.g., a loudspeaker. Although embodiments are described herein with respect to the human audible range, the benefits provided by the inclusion of the frequency-biasing filter in the compressor sidechain may be appreciated in applications that operate in other portions of the frequency spectrum, e.g., in ultrasonic or haptic applications, such that the term "audio" should be understood to include portions of the frequency spectrum outside the human audible portion.

The amplifier 106 receives power from a switched-mode power supply (SMPS) 104. The SMPS 104 receives power from a battery 103. Other embodiments are contemplated in which the SMPS 104 receives power from a type of power source other than a battery, e.g., buck converter, A/C-to-D/C power converter, etc. The output node of the SMPS 104 is fed back to a control block 102, e.g., digital signal processor (DSP) and/or state machine. That is, the output voltage and/or current of the SMPS 104 may be measured and fed back in a closed control loop fashion to the control block 102. Also fed back to the control block 102 is the input voltage to the SMPS 104, which is indicative of the voltage being supplied by the battery 103, i.e., the voltage at the output of the battery 103 may be slightly higher due to IR drop between the battery 103 and the SMPS 104. The control block 102 also receives the audio input 101 and the audio output 114 as inputs.

The control block 102 uses its inputs, as well as other parameters, to control the input current demanded by the SMPS 104. Additionally, the control block 102 uses its inputs to control the output voltage provided by the SMPS 104, e.g., in a class H manner. In one embodiment, the control block 102 may also use the load impedance, i.e., the impedance of the audio actuator 107, a model of the impedance of the battery 103, and a calculated inductor current, e.g., of the audio actuator 107. More specifically, the control block 102 controls the SMPS 104, in a closed loop fashion, to limit the current drawn by the SMPS 104 from the battery 103 to a maximum current value and to prevent the output voltage of the battery 103 from dropping below a minimum voltage value, the current drawn from the battery from rising above a maximum current value, or a combination thereof. In one embodiment, the limited maximum current value may be dynamically determined by the control block 102, whereas in other embodiments the limited maximum current value may be fixed. Advantageously, the overboost capacitor 105 may provide needed energy to the amplifier 106 during transients in which the control block 102 limits the input current to the SMPS 104 in a frequency-biased fashion, as described in more detail herein.

The current drawn from the battery 103 may be limited for one or more reasons. For example, the current may be limited to prevent damage to the battery 103 and/or components of the SMPS 104, e.g., a boost inductor or field-effect transistors (FETs), and/or components of the amplifier 106. For another example, the current may be limited to avoid causing the voltage supplied by the battery 103 to drop below an unacceptable limit, e.g., that would cause the device to reboot. For another example, the current may be limited due to larger system considerations. For example, the battery 103 may be used by other circuits of the device that includes the audio system 100 such that the design of the system/device allocates a maximum current draw to each circuit, including the audio system 100. Advantageously, the frequency-biased compressor 131 may compress the audio input 101 in a manner to use energy stored in an overboost capacitor 105 to provide peak power to the amplifier 106 during times when the battery 103 current is limited, as described in more detail herein.

The ground-coupled overboost capacitor 105 is connected to the output power node of the SMPS 104. The SMPS 104 uses the battery 103 voltage (e.g., 4 Volts) to pre-charge the overboost capacitor 105 to a voltage that is higher (e.g., 15 Volts) than the normal voltage (e.g., 8 Volts) at the output node, e.g., higher than real-time input power from the battery 103 can support. As described herein, the precharging of the overboost capacitor 105 to a higher-than-normal voltage may enable the amplifier 106 to be supplied with higher-than-normal power to accomplish increased loudness of the audio input 101, for example, high frequency transients such as a snare strike, rim shot or cymbal strike. The overboost capacitor 105 may be pre-charged by the SMPS 104 during intervals in which the amplifier 106 does not require overboost power from the overboost capacitor 105 while the input current to the SMPS 104 is limited. However, during intervals in which the amplifier 106 could use more power than the SMPS 104 can provide, e.g., because its input current draw from the battery is limited to a maximum value, additional power may be provided by the overboost capacitor 105 so that higher peak power may be delivered to the amplifier 106. The provision of additional power by the overboost capacitor 105 may mitigate clipping of the audio output 114. The provision of additional power by the overboost capacitor 105 may be particularly effective during large amplitude transients in the audio input 101 that tend to be high frequency transients. Although a single overboost capacitor 105 is shown in FIG. 1, multiple capacitors may be employed to store energy for provision to the amplifier 106.

The compressor 131 includes a main audio chain 111 and a sidechain 121. The main audio chain 111 includes a delay element 112 that delays the audio input 101 to generate a delayed audio input 113. A multiplying element multiplies the delayed audio input 113 by a gain 127 generated by a gain map 126 to generate the audio output 114.

The sidechain 121 includes a frequency-biasing filter 122 that receives the audio input 101 and generates a frequency-biased audio input 123 that is received by a power detector 124. The frequency-biasing filter 122 attenuates the audio input 101 as frequency increases. That is, higher frequencies are attenuated by the frequency-biasing filter 122 more than lower frequencies. Stated alternatively, the frequency-biasing filter 122 causes high frequency portions of the audio input 101 to have lower gain (i.e., higher attenuation) than low frequency portions of the audio input 101. In one embodiment, the attenuation approaches unity gain at low audio frequencies. Preferably, the frequency-biasing filter 122 attenuates the audio input 101 in a frequency-biased manner that models the available energy of the overboost capacitor 105 as a function of frequency in an inverse manner, as described in more detail below. In one embodiment, the frequency-biasing filter 122 comprises biquad filters, although other embodiments are contemplated in which the frequency-biasing filter 122 comprises other types of filters.

The power detector 124 generates a power prediction 125 based on the frequency-biased audio input 123. The power prediction 125 is effectively frequency-biased because it is based on the frequency-biased audio input 123 rather than the unfiltered audio input 101 itself. The frequency-biased power prediction 125 is provided to the gain map 126.

The gain map 126 also receives a threshold from the control block 102. The control block 102 generates the threshold based on the level of the audio input 101. In one embodiment, the control block 102 may also generate the threshold based on the measured SMPS 104 output. In one embodiment, the control block 102 includes separate elements for controlling the SMPS 104 and generating the threshold, e.g., DSP and state machine, respectively. In one embodiment, the state machine may be programmed to work symbiotically with tuning of the algorithm performed by the DSP that controls the SMPS 104. The gain map 126 generates the gain 127 based on the frequency-biased power prediction 125 and the threshold. Because the frequency-biasing filter 122 attenuates high frequencies of the audio input 101 more than low frequencies to generate the input 123 to the power detector 124, this causes the power prediction 125 to be greater when the audio input 101 power is characterized by low frequency than by high frequency (assuming comparable audio input 101 levels at low frequency and high frequency), which causes the gain map 126 to generate a gain 127 that is greater (i.e., an attenuation that is smaller) when the audio input 101 power is characterized by high frequency than by low frequency. That is, the compressor 131 decreases its compression of the audio output 114 as frequency increases and increases its compression as frequency decreases. In one embodiment, the system 100 includes an analog gain component that is fixed and a digital gain component (e.g., gain 127) that is variable, although other embodiments are contemplated in which the gain 127 is an analog gain.

Figure 2:
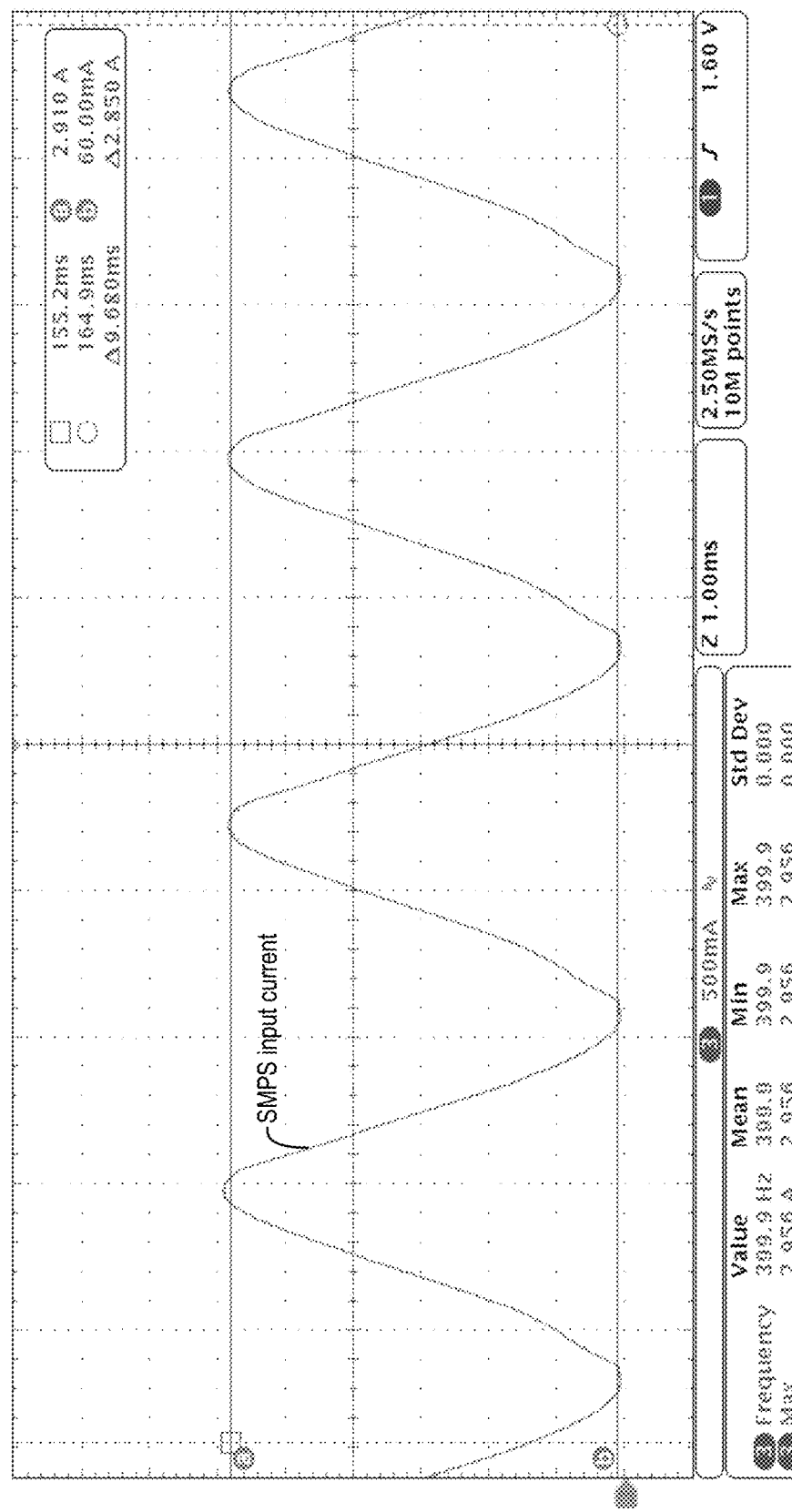
FIGS. 2 and 3 are example oscilloscope traces illustrating aspects of operation of the system of FIG. 1 in accordance with embodiments of the present disclosure.
Figure 3:
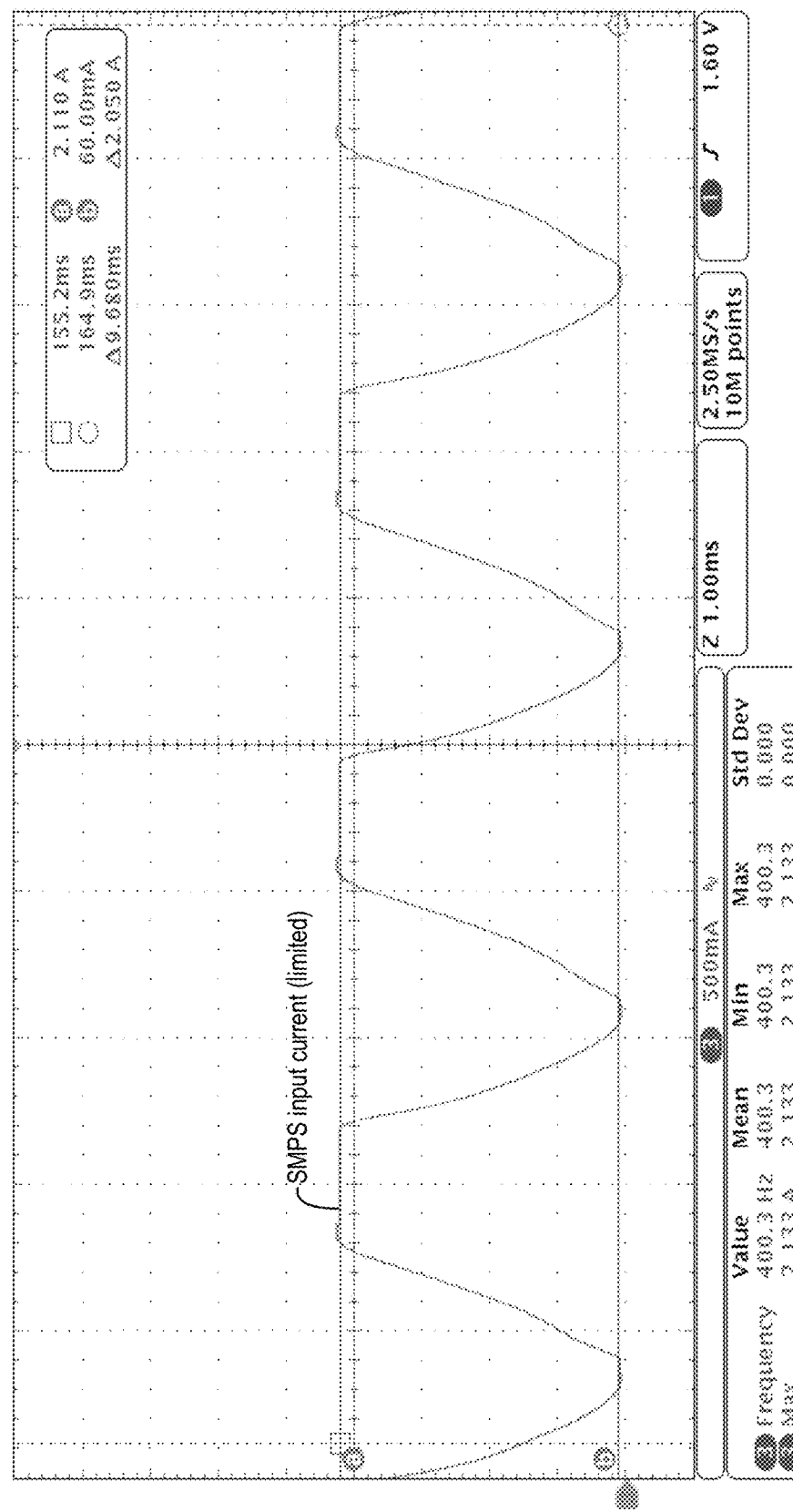

FIGS. 2 and 3 are example oscilloscope traces illustrating aspects of operation of the system 100 of FIG. 1 in accordance with embodiments of the present disclosure. In FIGS. 2 and 3, traces of the input current to the SMPS 104 are shown for comparison to illustrate a way the control block 102 limits the input current to the SMPS 104, as described above with respect to FIG. 1, as a tone is received as the audio input 101 and played by the system 100. The tone is a 200 Hz sinusoidal signal, resulting in an observed 400 Hz sinusoidal current drawn at the input of the SMPS 104. In the case of FIG. 2, the control block 102 is disabled from limiting current into the SMPS 104 such that the SMPS 104 draws a large range of input current between approximately zero and 2.9 Amps. The amplitude of the tone is arbitrarily chosen to be low enough to not cause damage to the SMPS 104 or the amplifier 106. In contrast in FIG. 3, although the tone amplitude is the same as in FIG. 2, the control block 102 is limiting the input current to the SMPS 104 to a maximum of approximately 2.1 Amps, as shown. During times when the input current into the SMPS 104 is limited, the overboost capacitor 105 may provide power to the amplifier 106, as described herein.

Figure 4:
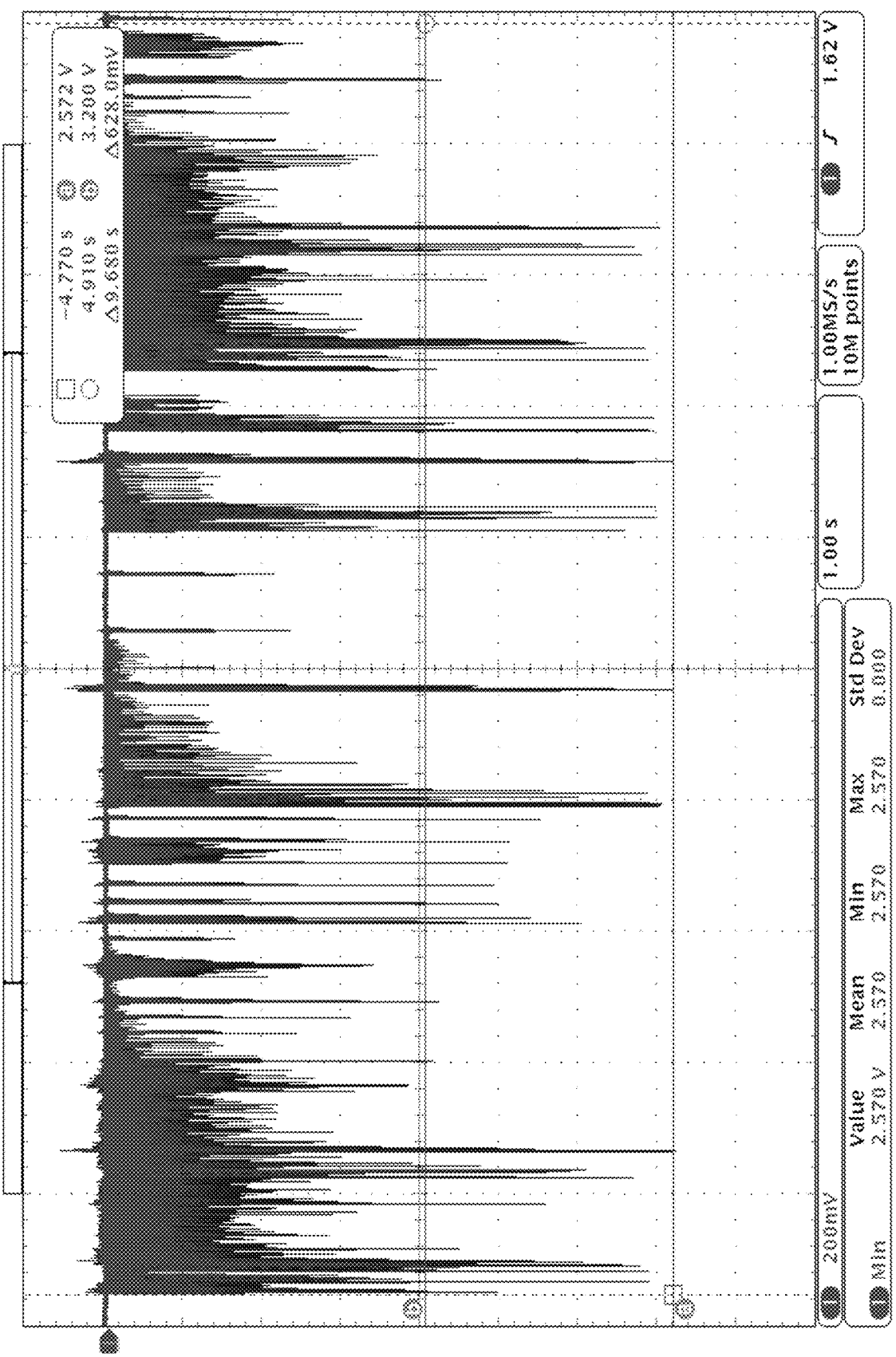
FIGS. 4 and 5 are example oscilloscope traces illustrating aspects of operation of the system of FIG. 1 in accordance with embodiments of the present disclosure.
Figure 5:
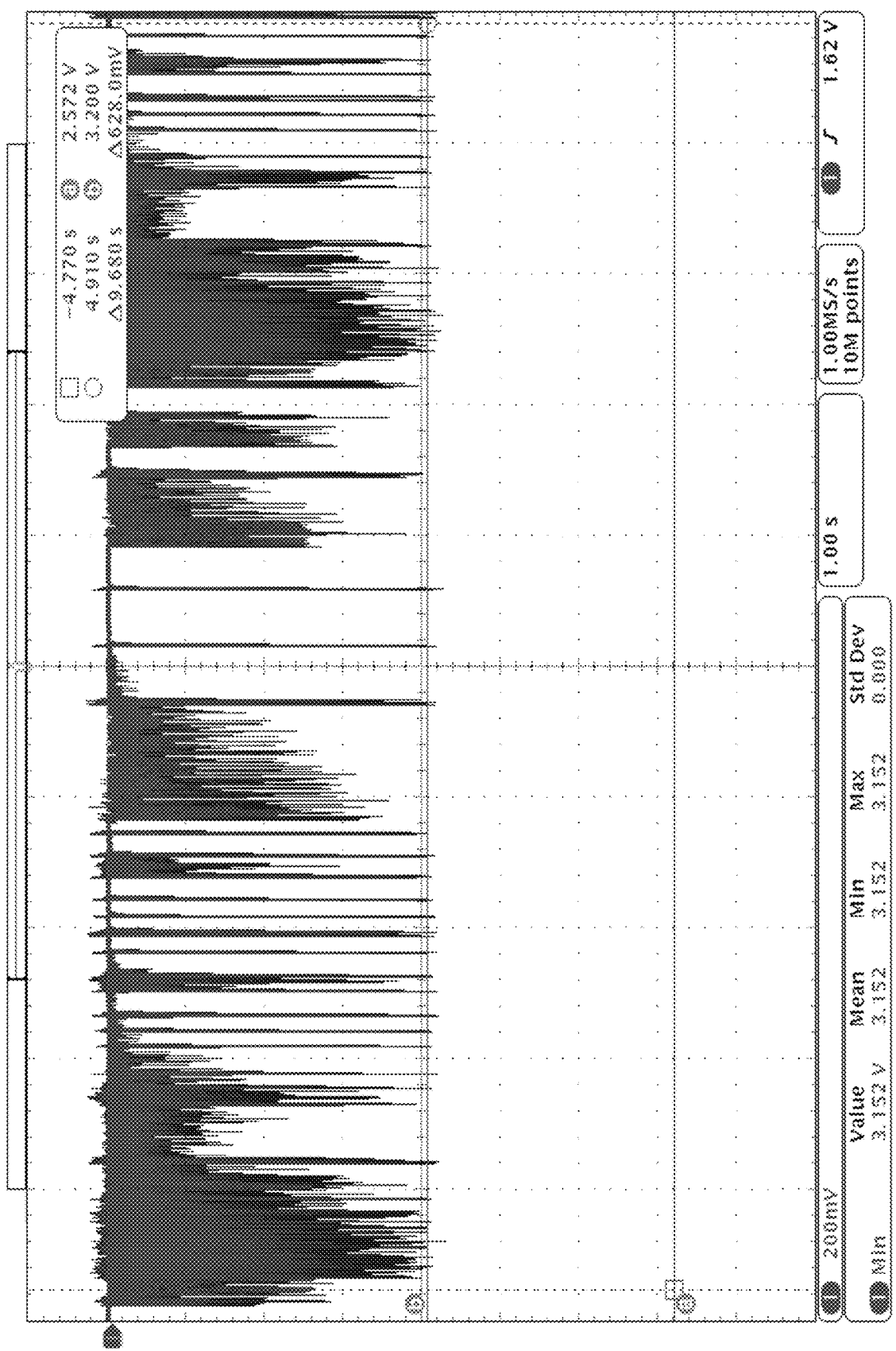

FIGS. 4 and 5 are example oscilloscope traces illustrating aspects of operation of the system 100 of FIG. 1 in accordance with embodiments of the present disclosure. In FIGS. 4 and 5, traces of the voltage at the input of the SMPS 104 are shown as music is being played through the system 100 over a relatively long duration of time. In the case of FIG. 4, the control block 102 is disabled from limiting current into the SMPS 104, corresponding to FIG. 2 above. Because the SMPS 104 draws a large amount of input current through the resistance of the power supply network, a significant IR drop occurs that manifests as a significant voltage droop at the SMPS 104 input, as shown. In the example of FIG. 4, the input voltage drops to approximately 2.6 Volts. However, in the case of FIG. 5, the control block 102 is limiting the input current to the SMPS 104, corresponding to FIG. 3 above. As a result, the voltage droop at the input of the SMPS 104 is controlled to a specified voltage, which is approximately 3.2 Volts in the example of FIG. 5. As explained above, during times when the input current into the SMPS 104 is limited, the overboost capacitor 105 may provide power to the amplifier 106, as described herein.

Figures 6, 7:
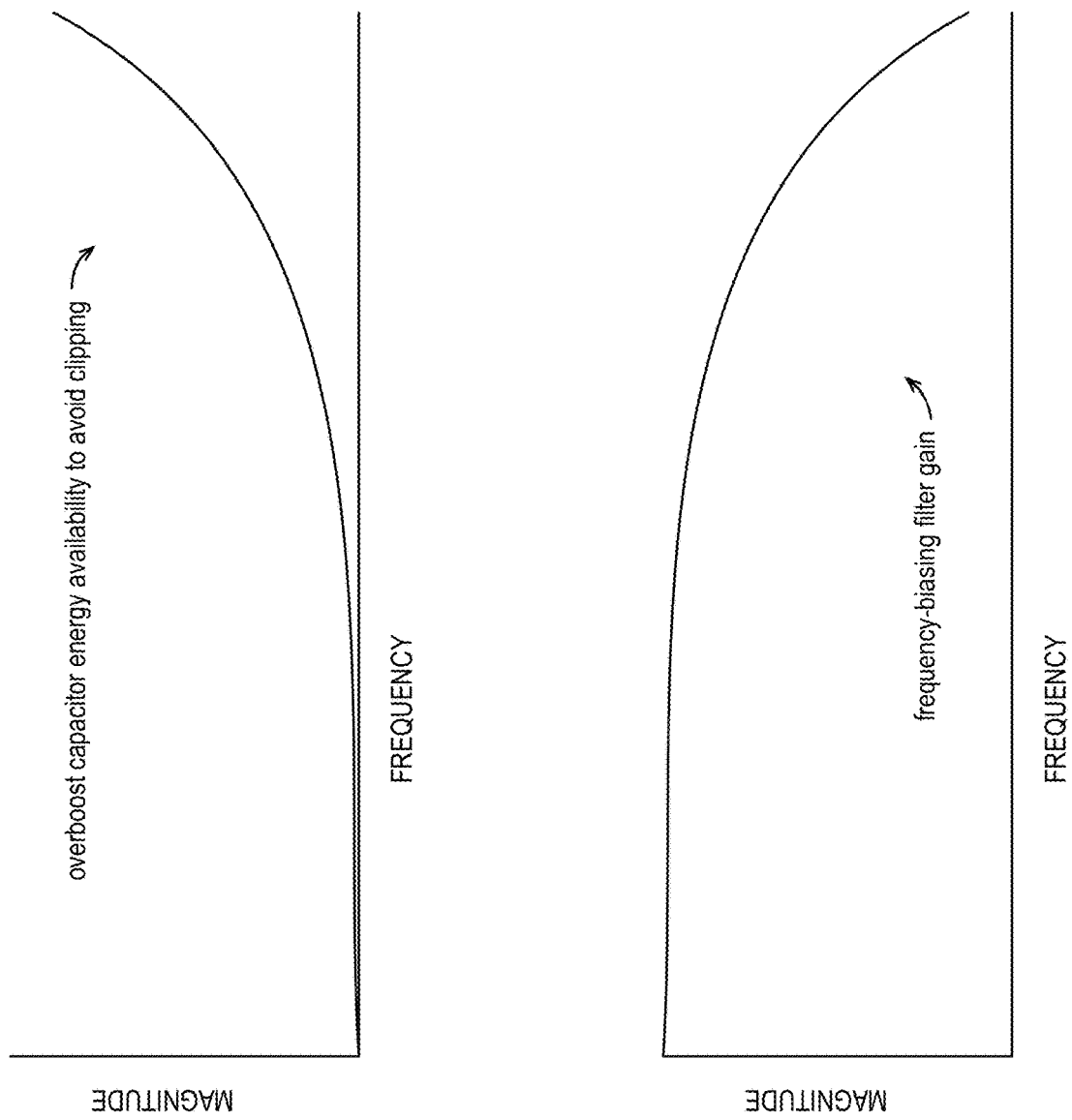
FIGS. 6 and 7 are example graphs illustrating aspects of the audio system of FIG. 1 in accordance with embodiments of the present disclosure.

FIG. 6 is an example graph illustrating aspects of an audio system, e.g., audio system 100 of FIG. 1, in accordance with embodiments of the present disclosure. As described above, there is a maximum amount of energy that may be stored on the overboost capacitor 105 by virtue of its capacitance. As the frequency decreases, the amount of energy that the amplifier 106 needs to deplete from the overboost capacitor 105 may exceed the maximum amount of energy that may be stored on the overboost capacitor 105, in which case the output of the amplifier 106 will be clipped while the SMPS 104 is in a power-limited state, i.e., while the SMPS 104 is supplying power below the amount of power being demanded by the amplifier 106. In this sense, the effectiveness of the energy usage of the overboost capacitor 105 to avoid clipping may be characterized as being a function of frequency of the audio output 114. Specifically, the clipping-avoidance effectiveness of the overboost capacitor 105 increases as frequency increases, as depicted in FIG. 6.

The graph of FIG. 6 illustrates energy availability of the overboost capacitor 105 to provide power to the amplifier 106 to avoid clipping as a function of frequency. As shown, the curve depicts an approximately exponentially increasing energy availability as frequency increases. The energy availability of the overboost capacitor 105 is depicted as a gain value, e.g., gain 127 of FIG. 1, applied to the audio input 101 to generate the audio output 114 that will utilize the maximum amount of energy from the overboost capacitor 105 without causing the amplifier 106 to clip. An observation that may be made from FIG. 6 is that the audio output 114 may have an extremely high peak (e.g., up to the maximum output node voltage of the SMPS 104) without depleting all the energy of the overboost capacitor 105, i.e., without clipping, for high frequency audio transients since their relatively short duration causes them to consume a relatively smaller amount of energy than a lower frequency signal.

FIG. 7 is an example graph illustrating aspects of an audio system, e.g., audio system 100 of FIG. 1, in accordance with embodiments of the present disclosure. The graph illustrates a gain magnitude of the frequency-biasing filter 122 as a function of frequency. In one embodiment, the frequency-biasing filter 122 gain magnitude approaches unity as the frequency approaches zero, and the gain magnitude decreases as frequency increases. That is, the frequency-biasing filter 122 attenuates higher frequencies more than lower frequencies. As shown, the curve depicts an approximately exponentially increasing attenuation magnitude of the frequency-biasing filter 122 as frequency increases that effectively is inverse to the energy availability curve of FIG. 6. Thus, the frequency-biasing filter 122 effectively inversely models the energy availability of the overboost capacitor 105 as a function of frequency, which by operation of the power detector 124 advantageously substantially causes the gain map 126 to generate a gain 127 that substantially tracks the energy availability of the overboost capacitor 105 as a function of frequency. Other embodiments are contemplated in which the frequency-biasing filter 122 increases the attenuation magnitude as frequency increases in a different, i.e., non-exponential, fashion that approximates matching of the energy availability of the overboost capacitor 105 as a function of frequency.

Figure 8:
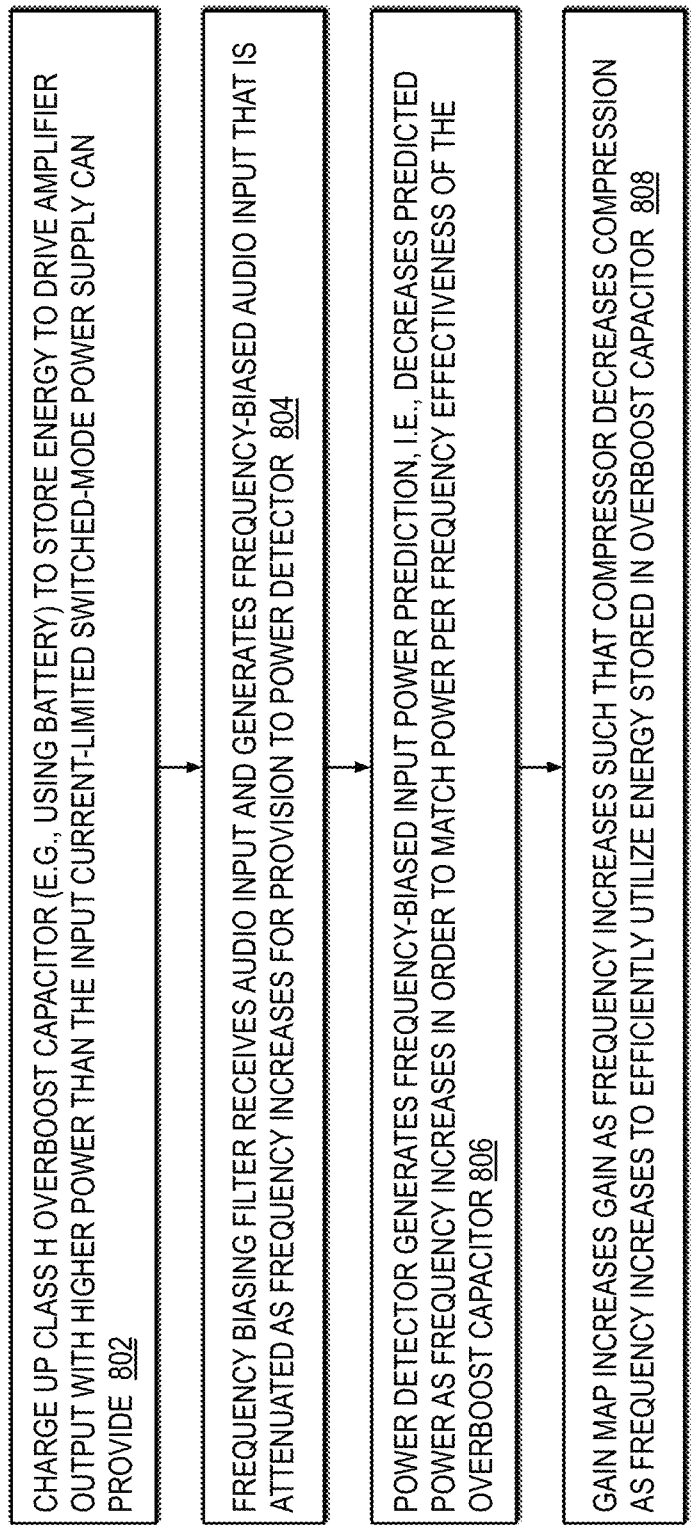
FIG. 8 is an example flow diagram illustrating operation of the audio system of FIG. 1, in accordance with embodiments of the present disclosure.

FIG. 8 is an example flow diagram illustrating operation of an audio system, e.g., audio system 100 of FIG. 1, in accordance with embodiments of the present disclosure. Operation begins at block 802.

At block 802, the overboost capacitor 105 is charged up to store energy to drive the amplifier 106 output with power during time intervals in which the current-limited SMPS 104 cannot provide the peak power demanded by the audio output 114. Operation proceeds to block 804.

At block 804, the frequency-biasing filter 122 receives the audio input 113 and generates the frequency-biased audio input 123 for provision to the power detector 124. The frequency-biased audio input 123 is attenuated as frequency increases. Operation proceeds to block 806.

At block 806, the power detector 124 generates the frequency-biased power prediction 125 using the frequency-biased audio input 123 generated by the frequency-biasing filter 122. More specifically, the predicted power 125 is decreased as frequency increases because the frequency-biased audio input 123 is decreased (i.e., attenuated) as frequency increases. Stated alternatively, the predicted power 125 is modified by the frequency-biasing filter 122 in the compressor sidechain 121 to decrease the predicted power 125 as frequency increases to match the power per frequency effectiveness of the overboost capacitor 105 charge storage. Operation proceeds to block 808.

At block 808, the gain map 126 increases the gain 127 as frequency increases such that the compressor 131 decreases the compression as frequency increases to effectively utilize the energy stored in the overboost capacitor 105. Stated alternatively, the compressor generates lower attenuation gain for high frequency audio input signals, therefore utilizing energy stored in the overboost capacitor that would not otherwise be utilized without the effect of the frequency-biasing filter.

By increasing compression as frequency decreases, i.e., by reducing the gain 127 as frequency decreases, an embodiment of which is described with respect to FIG. 8, the audio output 114 does not attempt to use more power than the pre-charged overboost capacitor 105 can provide, thereby advantageously avoiding clipping at low frequencies, which is advantageous because the harmonics induced by low frequency clipping may be audible and readily perceived by the listener as distortion. In contrast, by decreasing compression as frequency increases, i.e., by increasing the gain 127 as frequency increases, the audio output 114 uses all the power that the pre-charged overboost capacitor 105 can provide, thereby advantageously increasing loudness. Another advantage may be that, in an embodiment in which the frequency-biasing filter 122 is a digital filter, a relatively small amount of resources (e.g., MIPS, memory) of a DSP may be required.

Furthermore, even if some amount of clipping occurs at high frequencies, the harmonics induced by high frequency clipping may not be audible and therefore not perceived by the listener. In other words, because of the presence of the frequency-biasing filter 122, the compressor 131 effectively causes the audio output 114 to demand more power than the limited current would allow the SMPS 104 to provide, but only as much additional power as the overboost capacitor 105 will be able to supply at different frequencies. Stated alternatively, without the presence of the input current limit imposed by the control block 102 on the SMPS 104, the frequency biasing imposed by the frequency-biasing filter 122 and resultant higher gain 127 as frequency increases could cause the SMPS 104 to draw excessive current that could damage the battery and/or cause the system to malfunction because other circuits of the device are starved for power. In one embodiment, the gain 127 is attenuation gain such that the gain 127 value is always less than one; hence, the compressor 131 generates lower attenuation gain 127 as frequency increases and higher attenuation gain as frequency decreases.

Figure 9:
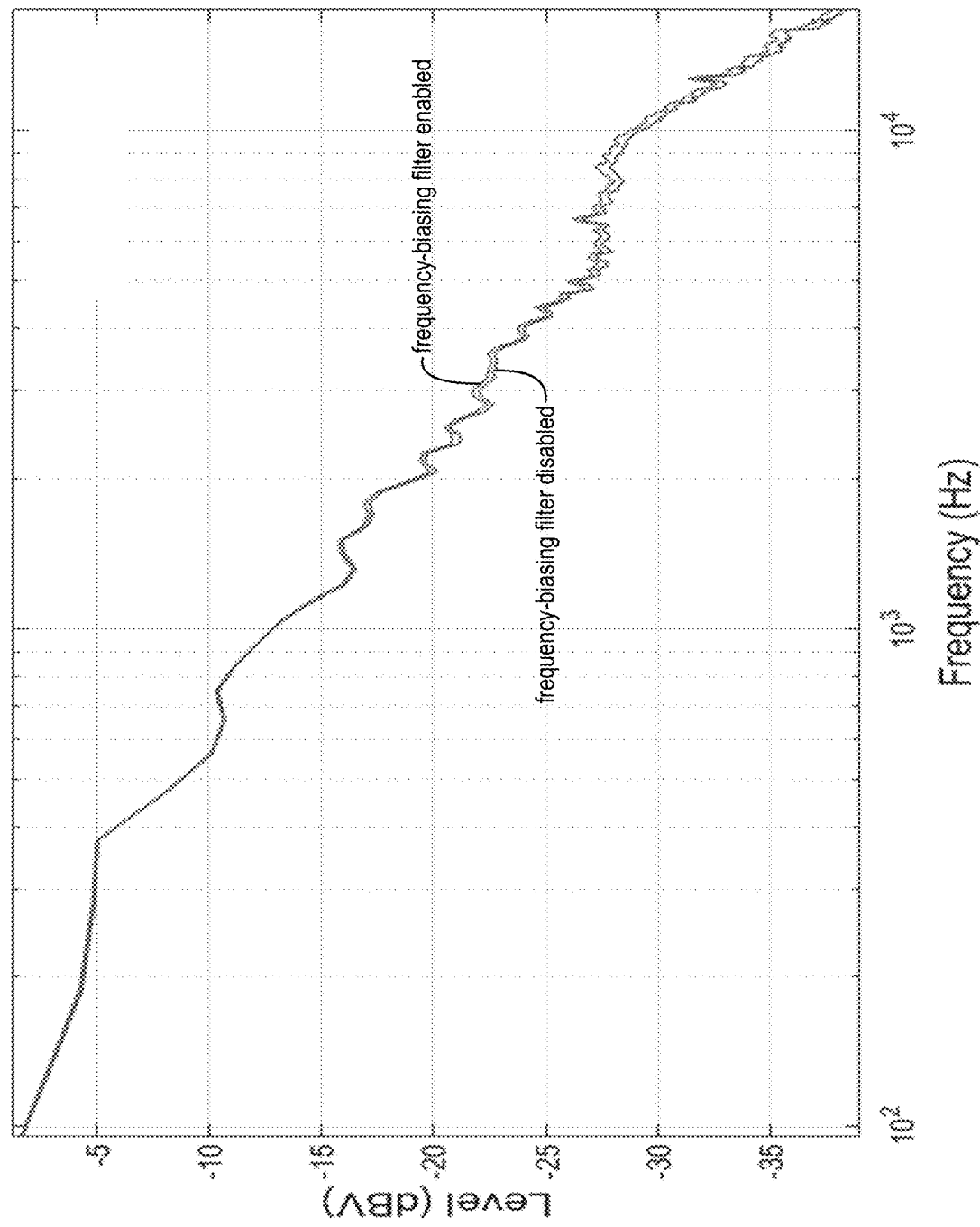
FIGS. 9, 10 and 11 are example graphs illustrating benefits of the audio system of FIG. 1, in accordance with embodiments of the present disclosure.
Figure 10:
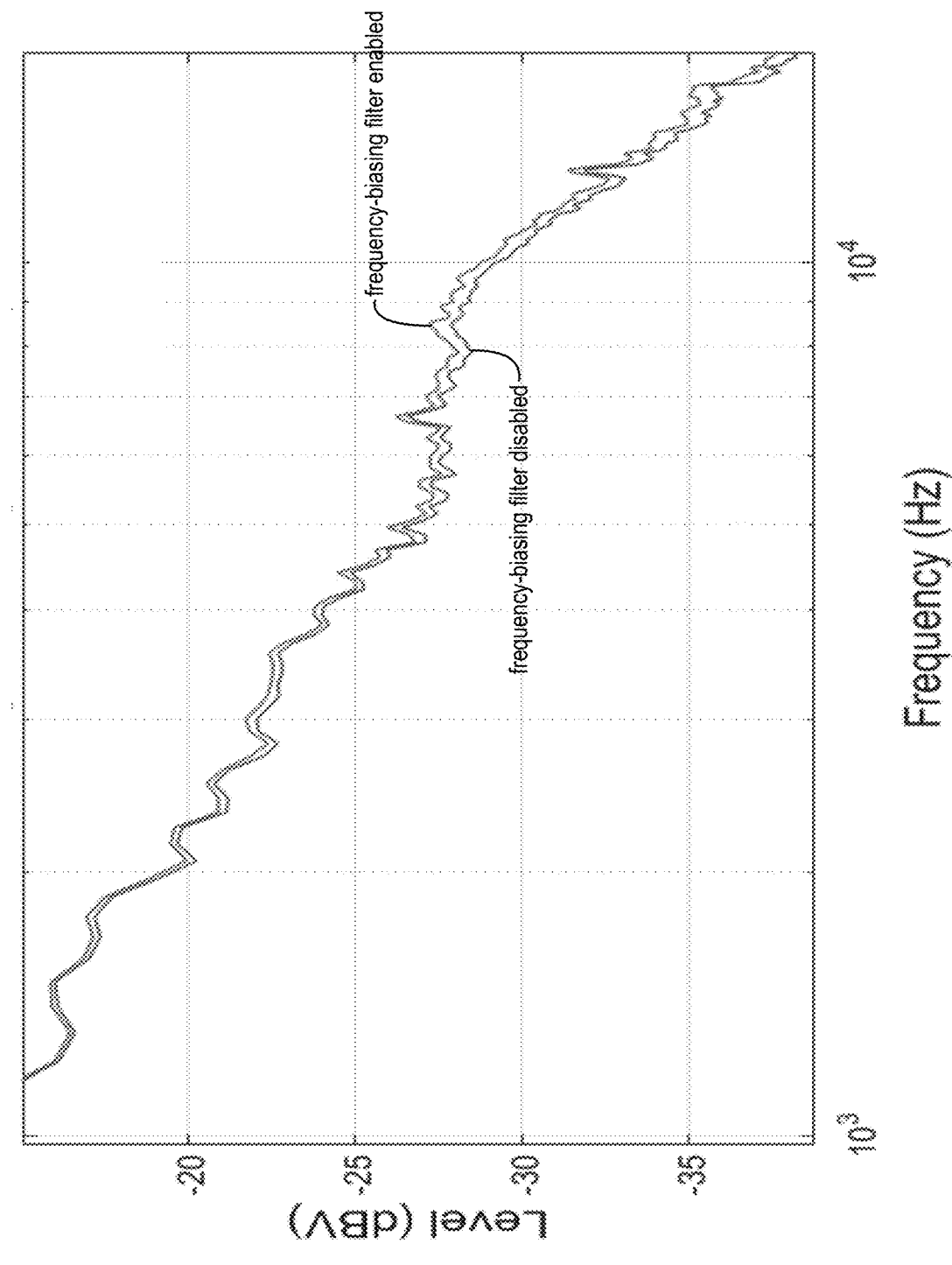

FIGS. 9 and 10 are example graphs illustrating benefits of the audio system 100 of FIG. 1, in accordance with embodiments of the present disclosure. FIG. 9 illustrates a resultant voltage spectrum indicating an enhanced output level of an audio system 100 that includes the frequency-biasing filter 122 of FIG. 1 to obtain enhanced use of energy stored in the overboost capacitor 105. As may be observed, the output levels are improved for the audio system 100 that includes a frequency-biasing filter 122 (upper curve), particularly at higher audio frequencies, over a similar audio system that is absent the frequency-biasing filter 122 (lower curve), e.g., in which the audio input 101 is provided directly to the power detector 124 without being frequency-biased. FIG. 9 was produced by taking various audio tracks, combining them into one vector, removing any silence, and then taking a Fast Fourier Transform (FFT) of the resulting silence-removed vector. FIG. 10 is a zoomed-in version of FIG. 9 to show in more detail the higher portion of the frequency spectrum. The enhanced output level of the audio system 100 at higher frequencies may be more easily observed in FIG. 10.

Figure 11:
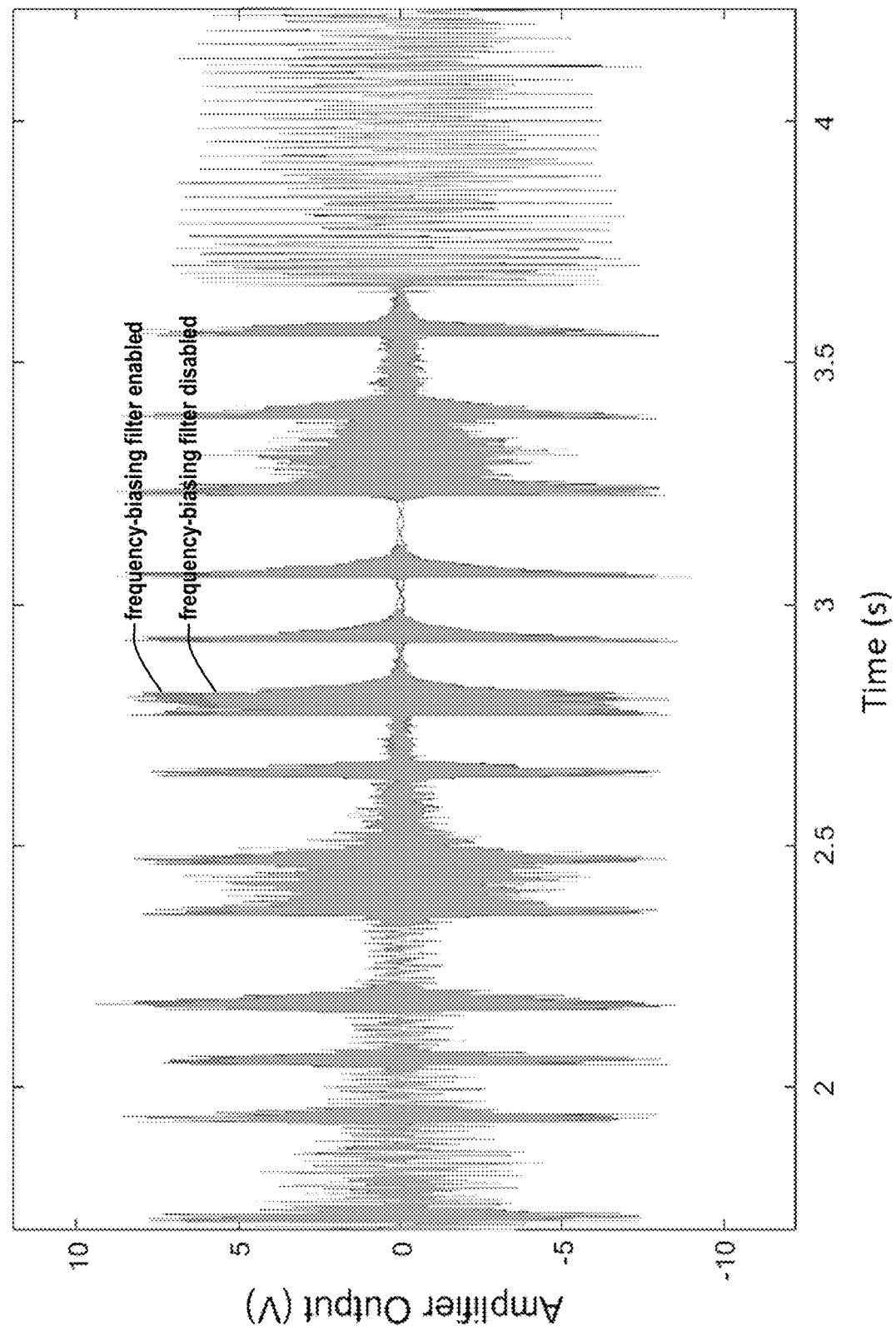

FIG. 11 is an example graph illustrating benefits of the audio system 100 of FIG. 1, in accordance with embodiments of the present disclosure. FIG. 11 illustrates amplifier 106 output voltage over time as sound, e.g., music, is being played by the audio system 100. The darker portions, which extend higher and lower than the lighter portions (respectively above and below approximately +5 and −5 Volts), illustrate the output voltage afforded by an audio system such as audio system 100 that includes the frequency-biasing filter 122, whereas the lighter portions illustrate the output voltage afforded by a similar audio system that is absent the frequency-biasing filter 122, e.g., in which the audio input 101 is provided directly to the power detector 124 without being frequency-biased. As may be observed, the dynamic range may be increased in an audio system having the frequency-biasing filter 122 relative to a similar audio system absent the frequency-biasing filter 122.

FIGS. 12 through 21 are example oscilloscope traces illustrating operation of the system 100 of FIG. 1 in accordance with embodiments of the present disclosure. In each Figure, the input current to the SMPS 104 is shown, as in FIGS. 2 and 3. The output voltage supplied by the SMPS 104 to the amplifier 106 and the output voltage of the amplifier 106 are also shown. The class H mode operation of the control block 102 is enabled to allow the voltage provided by the SMPS 104 to the amplifier 106 to track the demand of audio output 114. Additionally, an output frequency exists (e.g., in the range of a few kHz) at which point the control block 102 is not able to sufficiently track the demand such that the class H output node of the SMPS 104 effectively becomes a DC value, similar to an embodiment in which the output of the SMPS 104 is fixed. As a result, in most of the Figures, especially those having a low frequency tone (e.g., 200 Hz), the SMPS 104 output tracks the output tone. However, in some of the Figures having a high frequency tone (e.g., 5 kHz), a different shape is observed at the SMPS 104 output node. More specifically, the SMPS 104 is targeting a DC voltage, but is discharging and recharging every half cycle when the SMPS 104 power limit is reached, as advantageously enjoyed by the inclusion of the frequency-biasing filter 122, as described herein.

Figure 12:
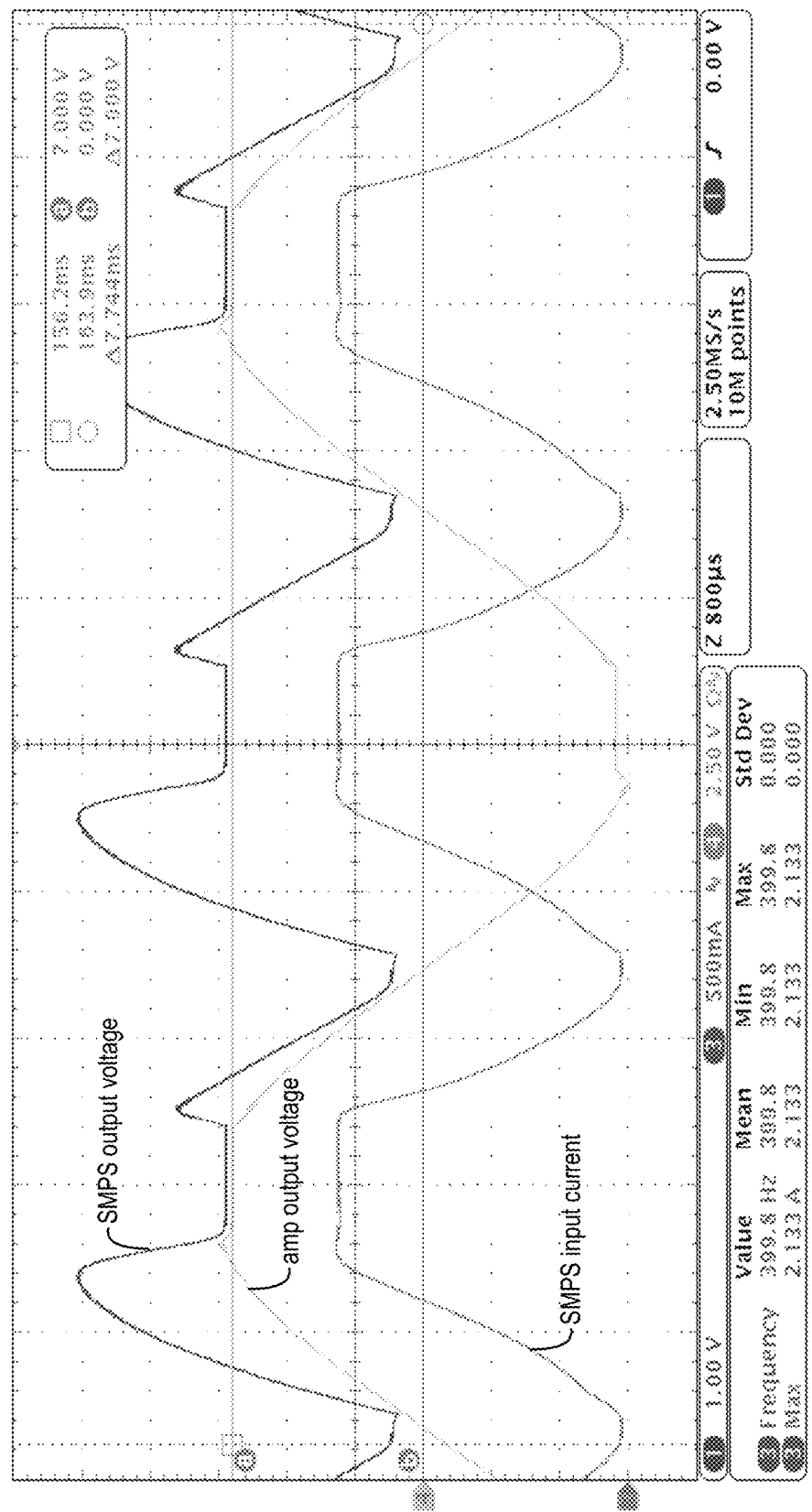
FIGS. 12 through 21 are example oscilloscope traces illustrating operation of the system of FIG. 1 in accordance with embodiments of the present disclosure.

In FIG. 12, a 200 Hz tone is played (observed as the amplifier 106 output voltage) resulting in an observed 400 Hz sinusoidal current drawn at the input of the SMPS 104, as in FIG. 3. The control block 102 is enabled to limit the input current to the SMPS 104 as in FIG. 3, but the compressor 131 is disabled, i.e., the audio input 101 is passed directly through as the audio output 114. As a result, the SMPS 104 input current follows the SMPS 104 output voltage when a load (e.g., speaker 107) is connected to the output of the amplifier 106. As may be observed, the amplifier 106 output becomes clipped when the current limit is reached, because the SMPS 104 cannot provide sufficient power in the current-limited condition. Energy is taken from the overboost capacitor 105 in the form of charge, which decreases the overboost capacitor 105 voltage until all the extra energy in the overboost capacitor 105 is depleted, at which time the headroom voltage is gone (i.e., the SMPS 104 output voltage has dropped to approximately 7 Volts, as shown). At that time, the current-limited SMPS 104 is providing all the power to the amplifier 106 (i.e., the overboost capacitor 105 is no longer providing power) at the maximum voltage the SMPS 104 can provide given the current limit and the speaker load 107. As the amplifier 106 output signal decreases (i.e., the output tone naturally decays), it may be observed that the SMPS 104 output is able to recover once the SMPS 104 is no longer current-limited, at which point the SMPS 104 output node also drops along with the amplifier 106 output according to the class H tracking performed by the control block 102.

Figure 13:
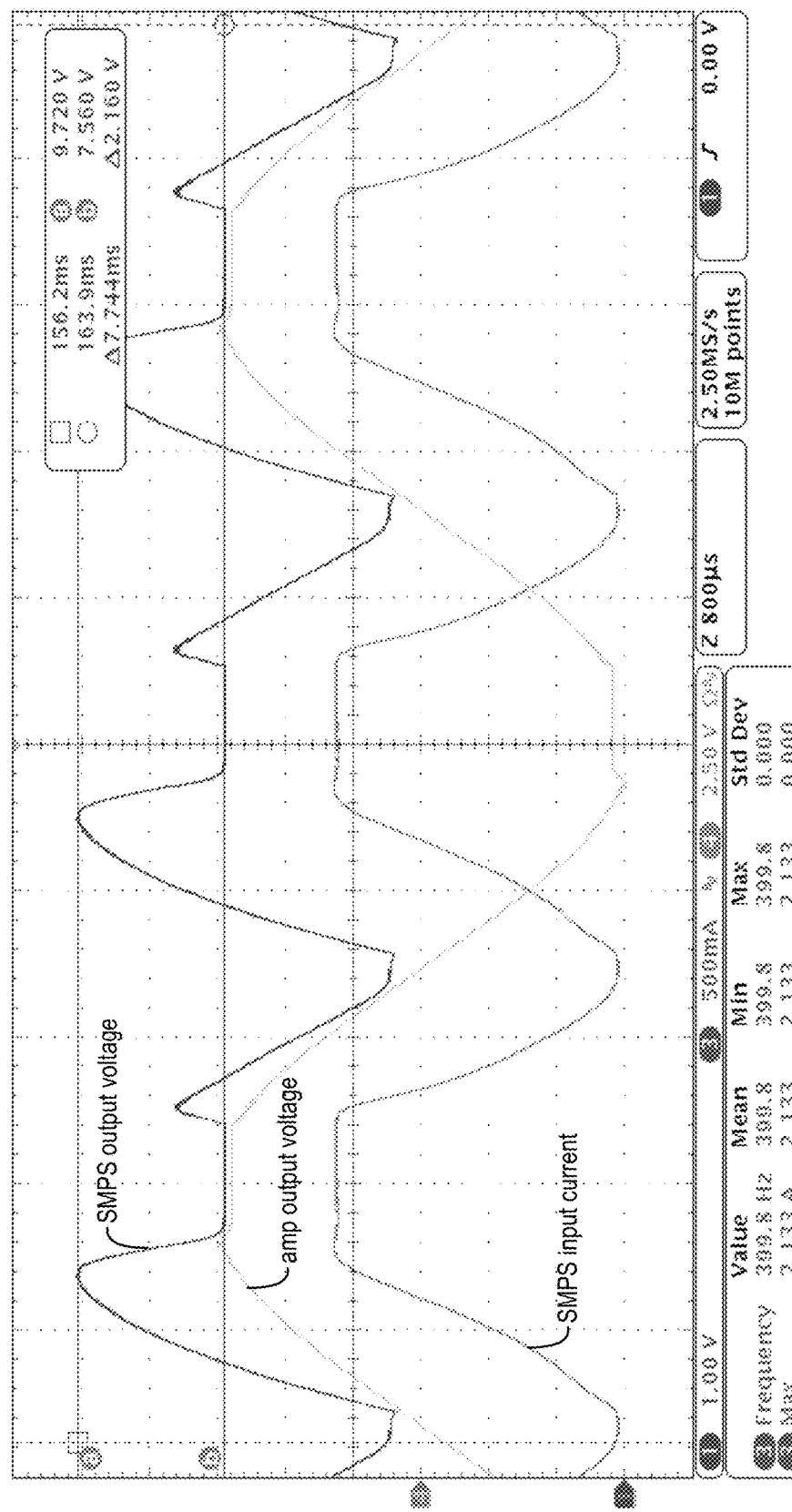

FIG. 13 depicts a similar trace to FIG. 12 but with the oscilloscope cursors programmed to illustrate the change in voltage on the SMPS 104 output during the time that the headroom provided by the overboost capacitor 105 is depleted.

Figure 14:
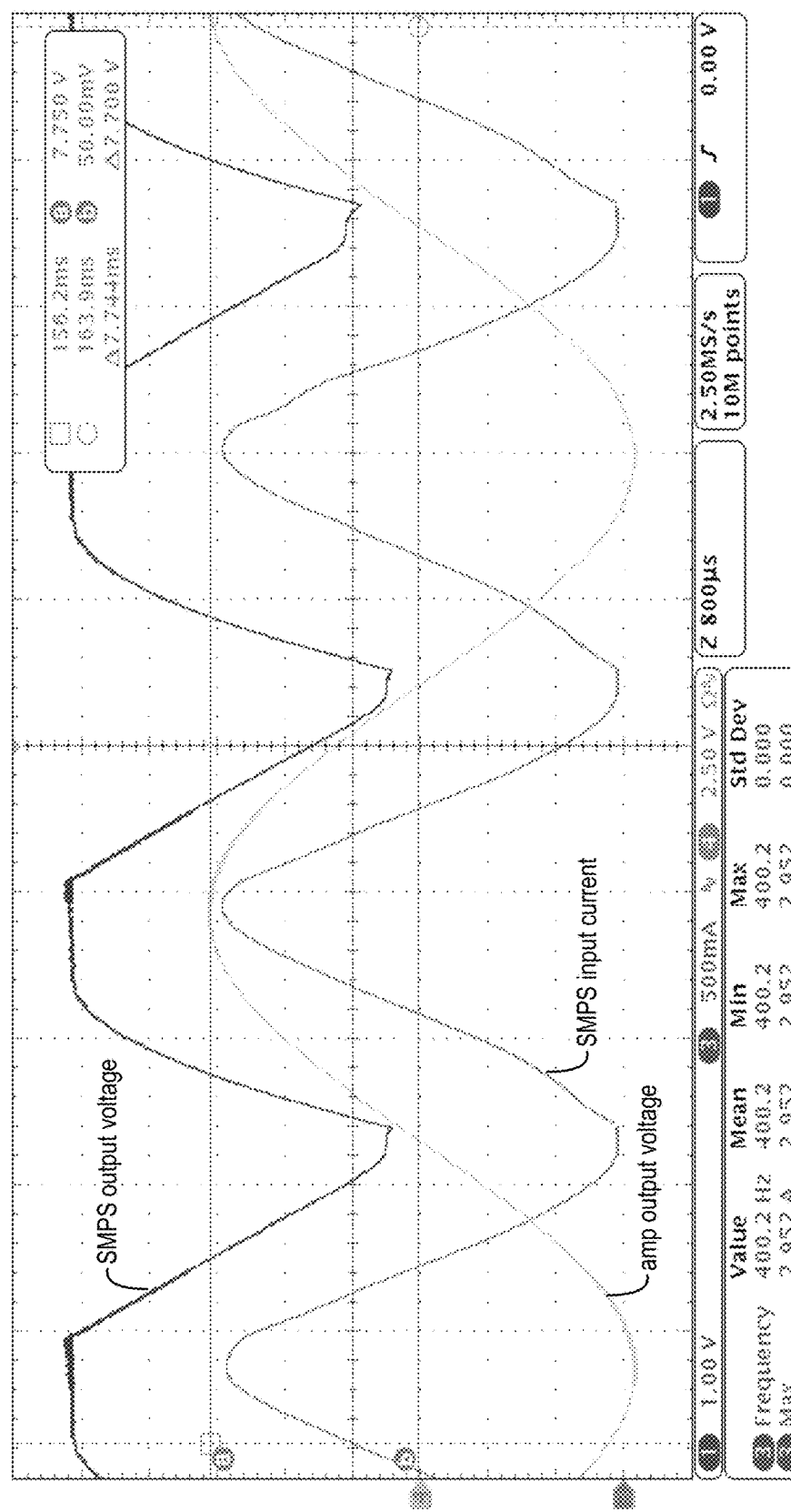

In FIG. 14, a similar amplitude and frequency tone is played. However, in FIG. 14 the control block 102 is disabled from limiting the SMPS 104 input current and the compressor 131 is disabled. Because the SMPS 104 is not current-limited, it is able to provide all the power the audio output 114 is demanding. Therefore, the audio output 114 is played back without clipping, as shown. As may also be observed, the overboost capacitor 105 does not give up energy, and the SMPS 104 output node does not droop, in contrast to FIGS. 12 and 13.

Figure 15:
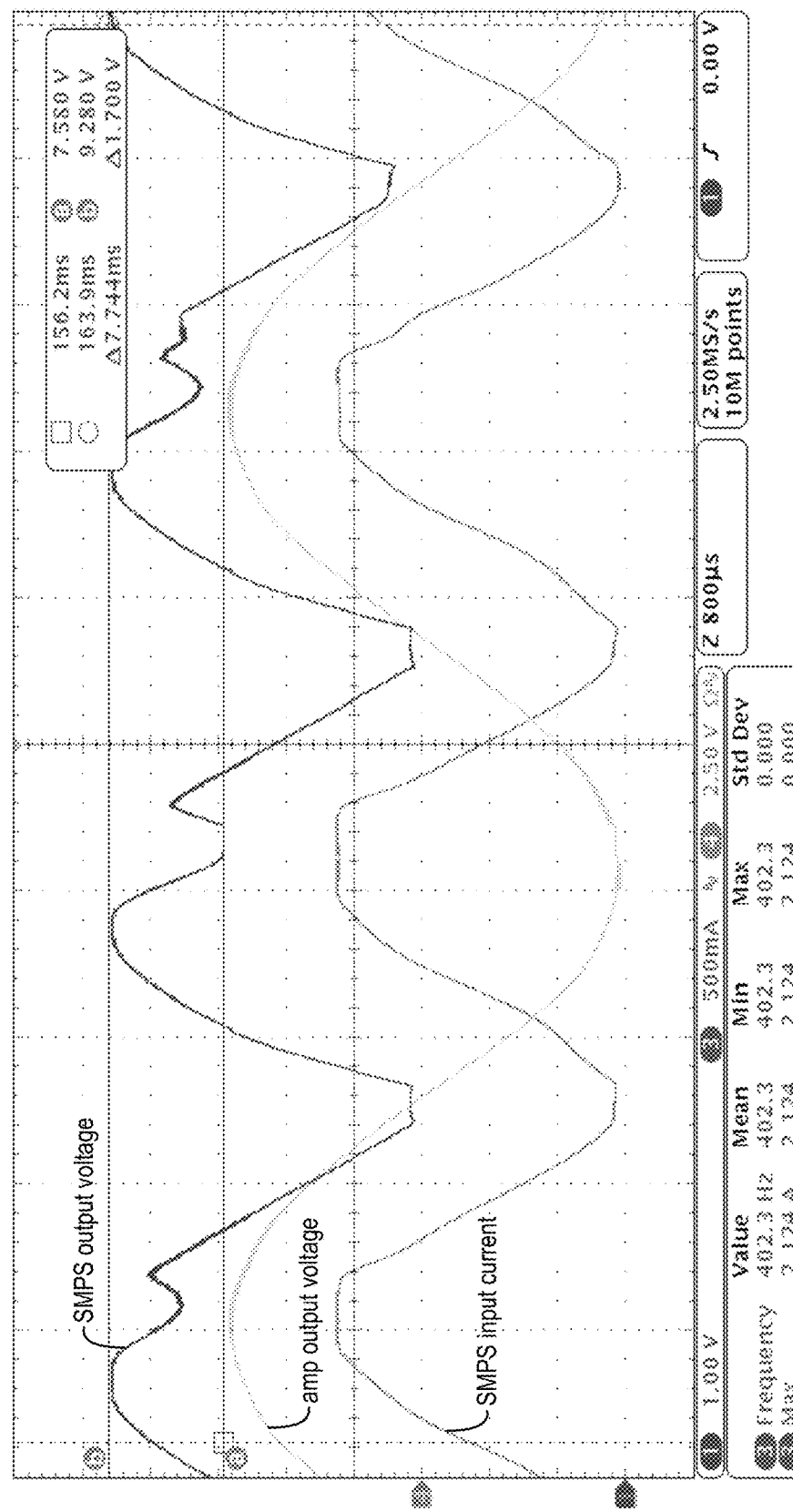

In FIG. 15, the same magnitude tone is played as in FIGS. 12-14. However, in FIG. 15, the frequency-biasing filter 122 is enabled (along with the rest of the compressor 131). In addition, the control block 102 is enabled to limit the current input to the SMPS 104, which is observed during the time the SMPS 104 output voltage decays by giving up charge to the amplifier 106 output stage. However, advantageously, the frequency-biasing filter 122 enables the compressor 131 to accurately model the amount of residual energy in the overboost capacitor 105. Therefore, the overboost capacitor 105 energy decays during the time the SMPS 104 is power-limited, but the amplifier 106 output is not clipped because the overboost capacitor 105 energy is not fully depleted. Thus, the frequency-biasing compressor 131 operates to provide an unclipped low frequency 200 Hz output, as shown.

Figure 16:
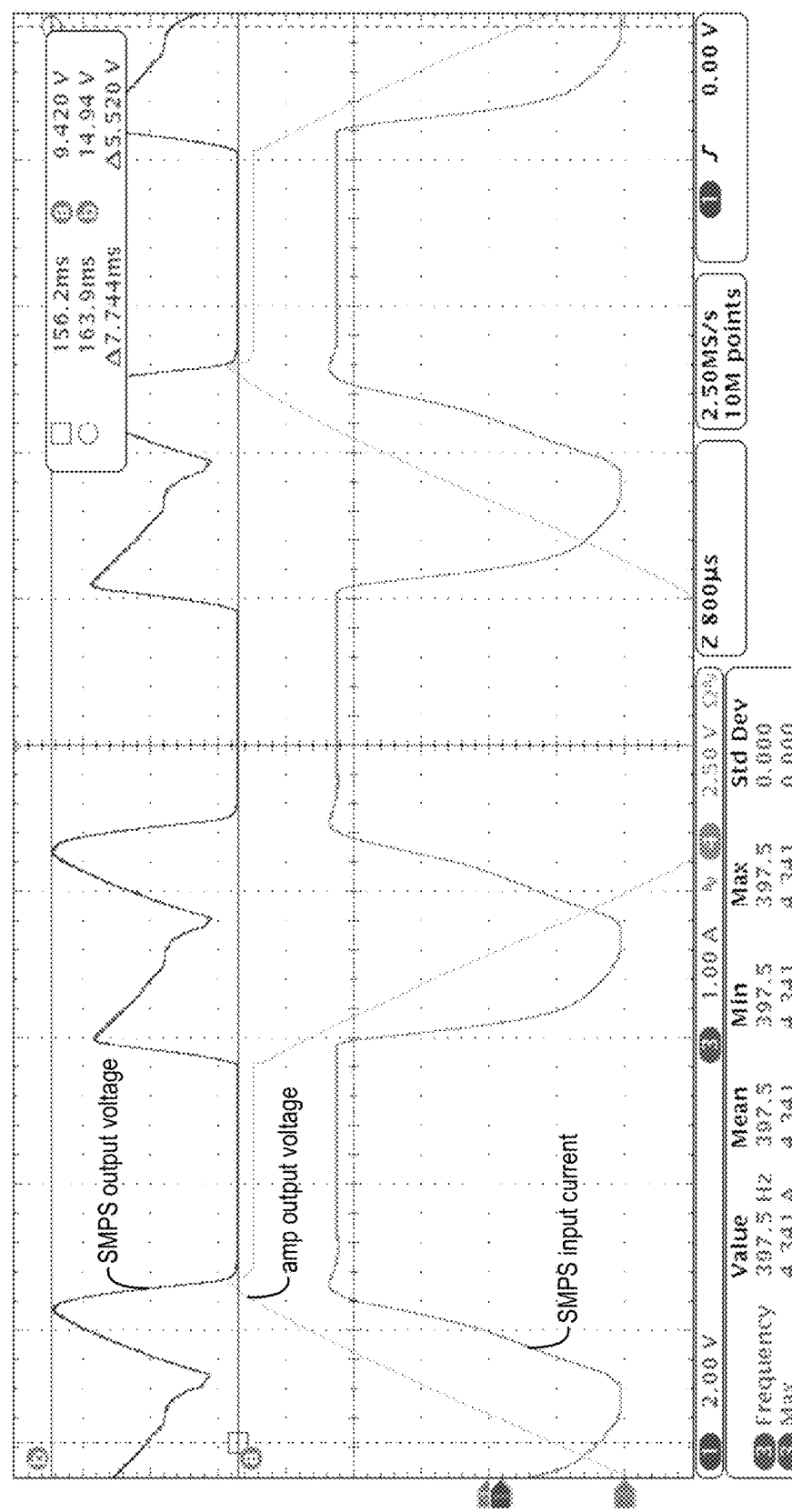

In FIG. 16, the compressor 131 is disabled, and the magnitude of the 200 Hz tone is turned up to a maximum volume (0 dBFS). As shown in the legend, the load 107 demands a maximum current value of greater than 4.3 Amps. Although in FIG. 16 the control block 102 is disabled from limiting the SMPS 104 input current, the SMPS 104 imposes an internal limit of 4 Amps to protect its internal components. As shown, the amplifier 106 output is significantly clipped. As may be observed, the SMPS 104 output node is charged to almost 15 Volts, which is its maximum voltage, and decays approximately 5.5 Volts down to less than 9.5 Volts.

Figure 17:
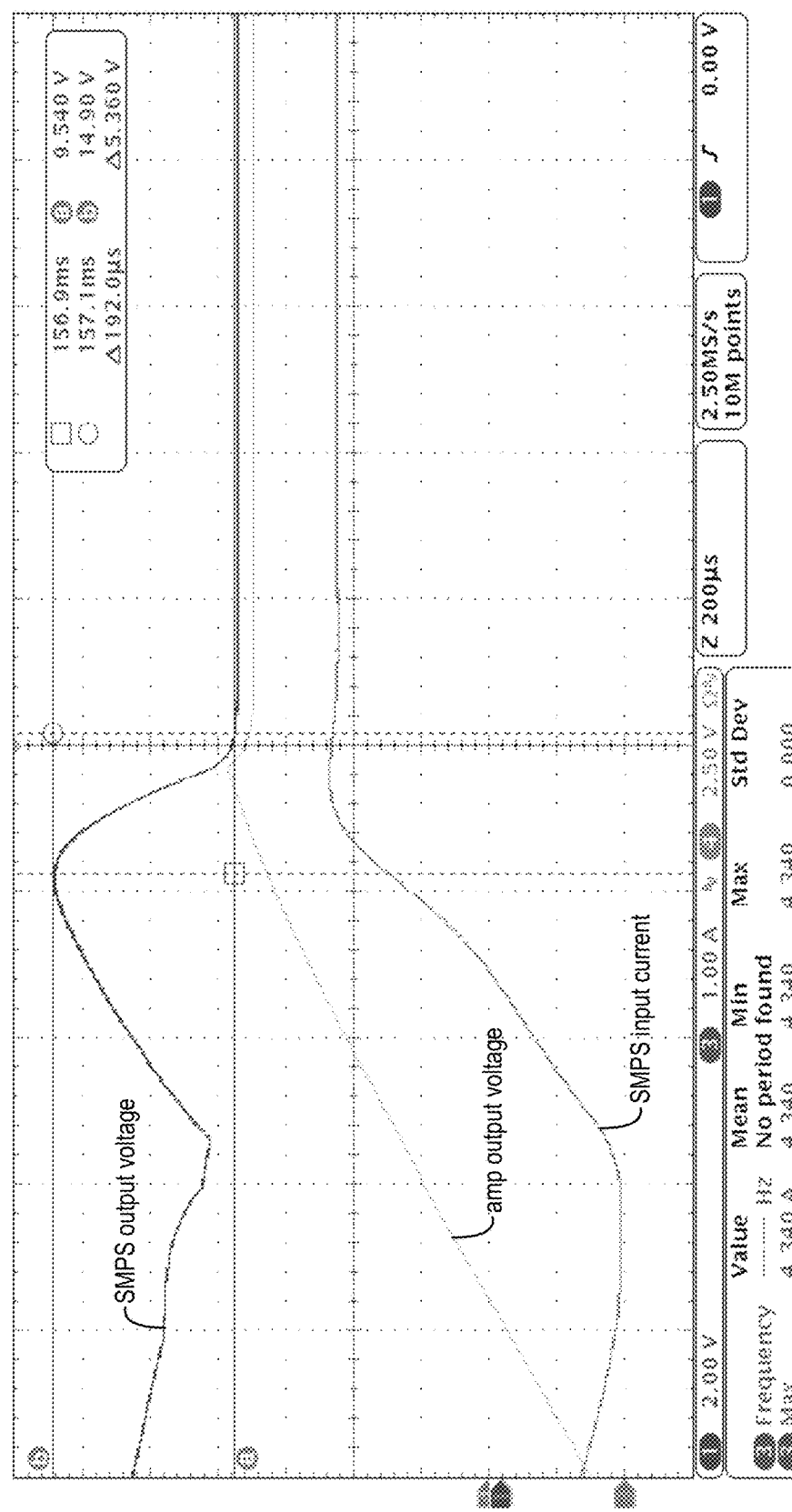

FIG. 17 is a zoomed-in version of FIG. 16. Time and magnitude cursors are enabled to show Δtime and ΔV of the SMPS 104 output node during the period it provides energy to the amplifier 106 output. As shown, the overboost capacitor 105 energy was depleted in approximately 192 microseconds, giving a sense of how quickly the overboost capacitor 105 energy is depleted for its size in the example. Thus, it may be observed that the overboost capacitor 105 may be able to provide energy for a sufficient time to prevent clipping for a high frequency audio output 114 of a given amplitude, but not for a lower frequency audio output 114 of the same magnitude, depending on the load 107, the tuning of the system 100, and the size of the overboost capacitor 105.

Figure 18:
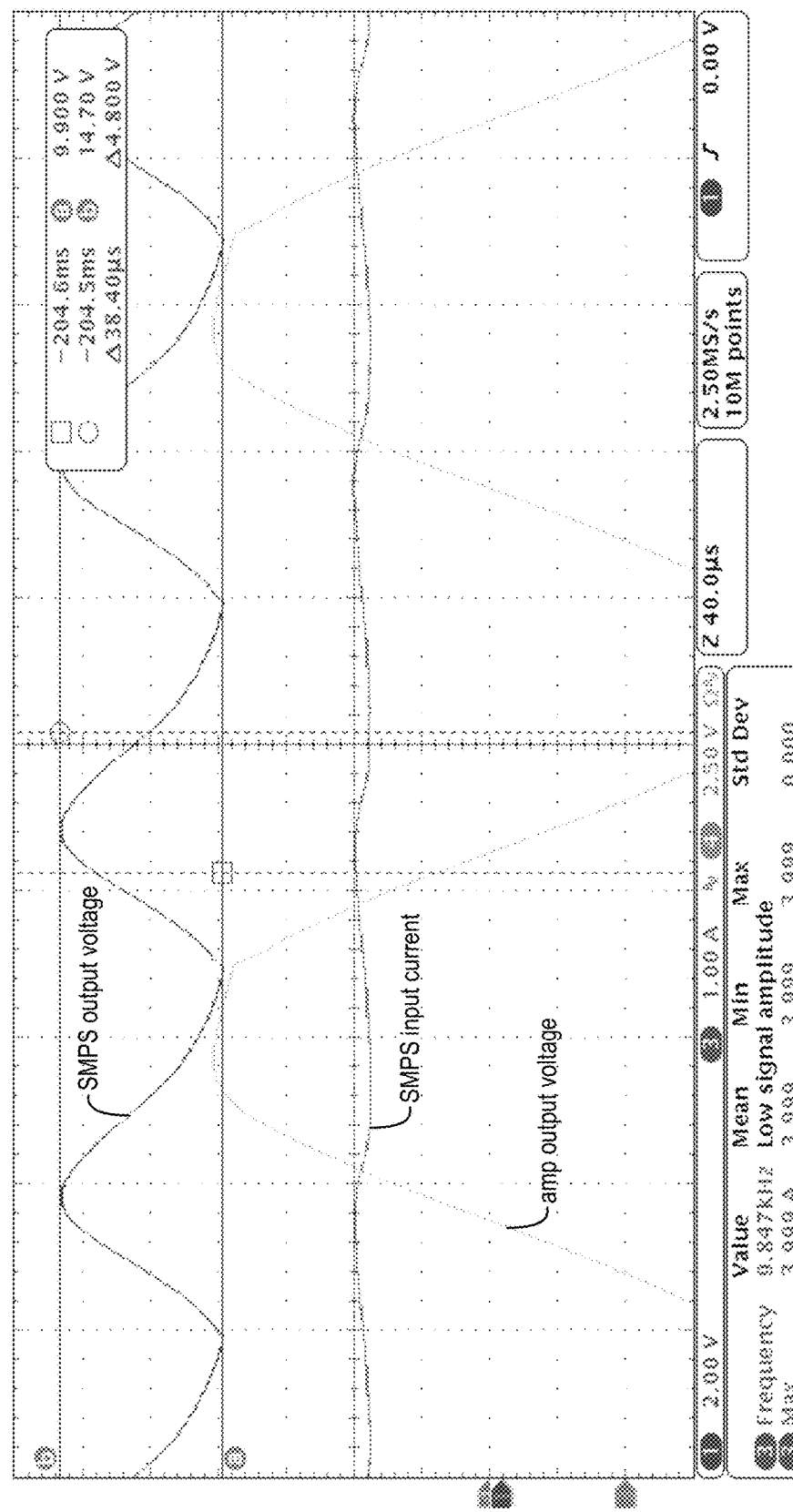

In FIG. 18, a maximum volume high frequency 5 kHz audio input 101 signal is demanded. Therefore, a 10 kHz frequency of the SMPS 104 current is observed. The frequency-biasing filter 122 is enabled, and the SMPS 104 internal current limiting is enabled. (The observed difference in shape of the SMPS 104 input current from the low frequency traces is attributable to the nature of the impedance of the power supply network.) As may be observed, the SMPS 104 output node voltage decays in approximately the same time that the amplifier 106 output voltage spends in a peak cycle. As a result, the amplifier 106 output waveform is deflected slightly, but not clipped. Thus, as may be observed in the example of FIG. 18, the presence of the frequency-biasing filter 122 facilitated the playing of a high frequency signal at maximum volume without clipping. The decaying and recharging of the SMPS 104 output voltage for each half cycle of the waveform may also be observed.

Figure 19:
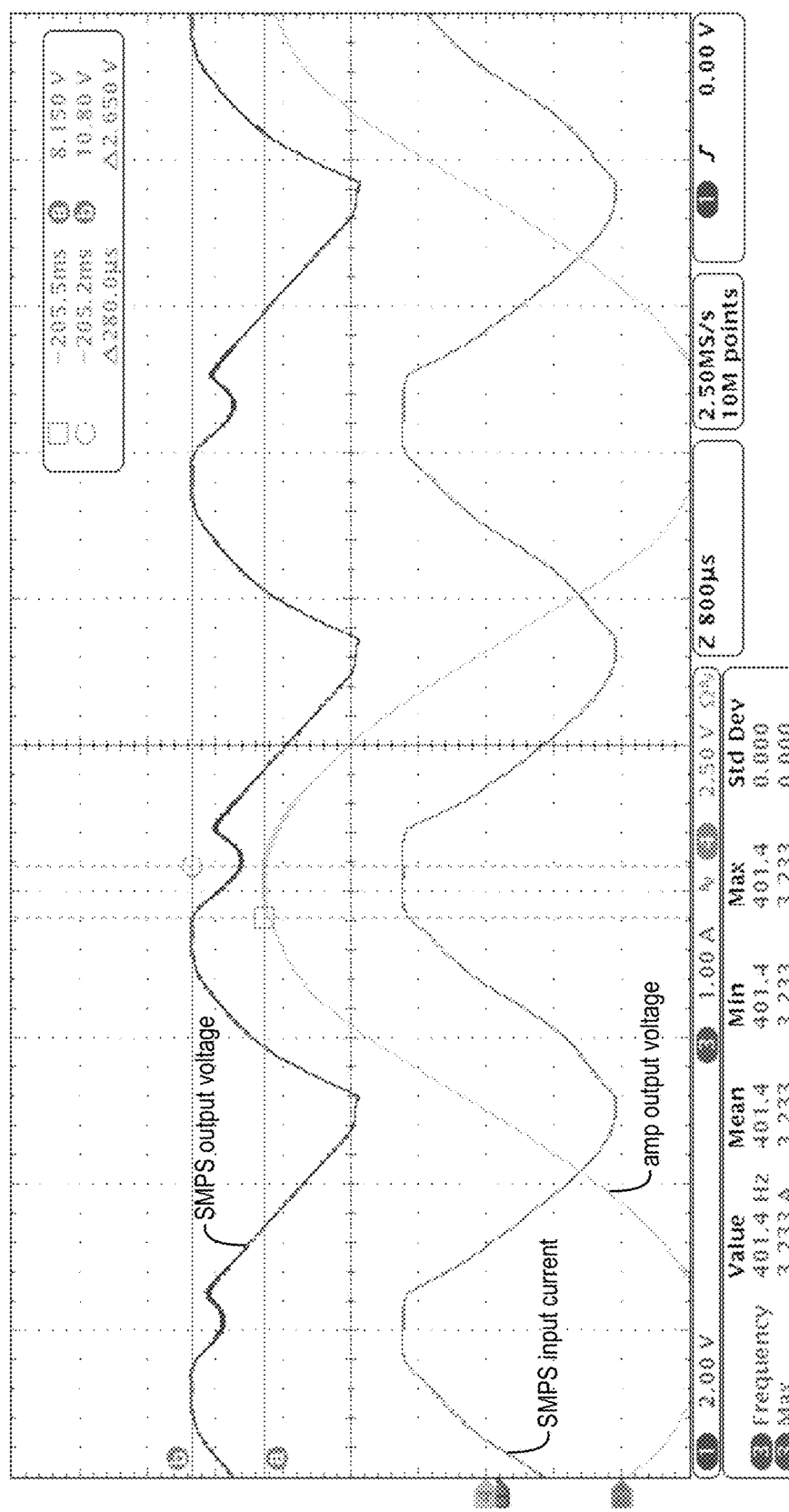

In FIG. 19, a 200 Hz tone is played with significant magnitude, similar to FIG. 14. However, the SMPS 104 limit has been increased from 2 Amps to 3 Amps. The frequency-biasing filter 122 is enabled. As observed, although the energy from the overboost capacitor 105 decays at the SMPS 104 output, the frequency-biased compressor 131 compresses the audio output 114 just enough so that the overboost capacitor 105 can provide sufficient energy for the duration of the audio output 114 peak such that the amplifier 106 output is advantageously not clipped.

Figure 20:
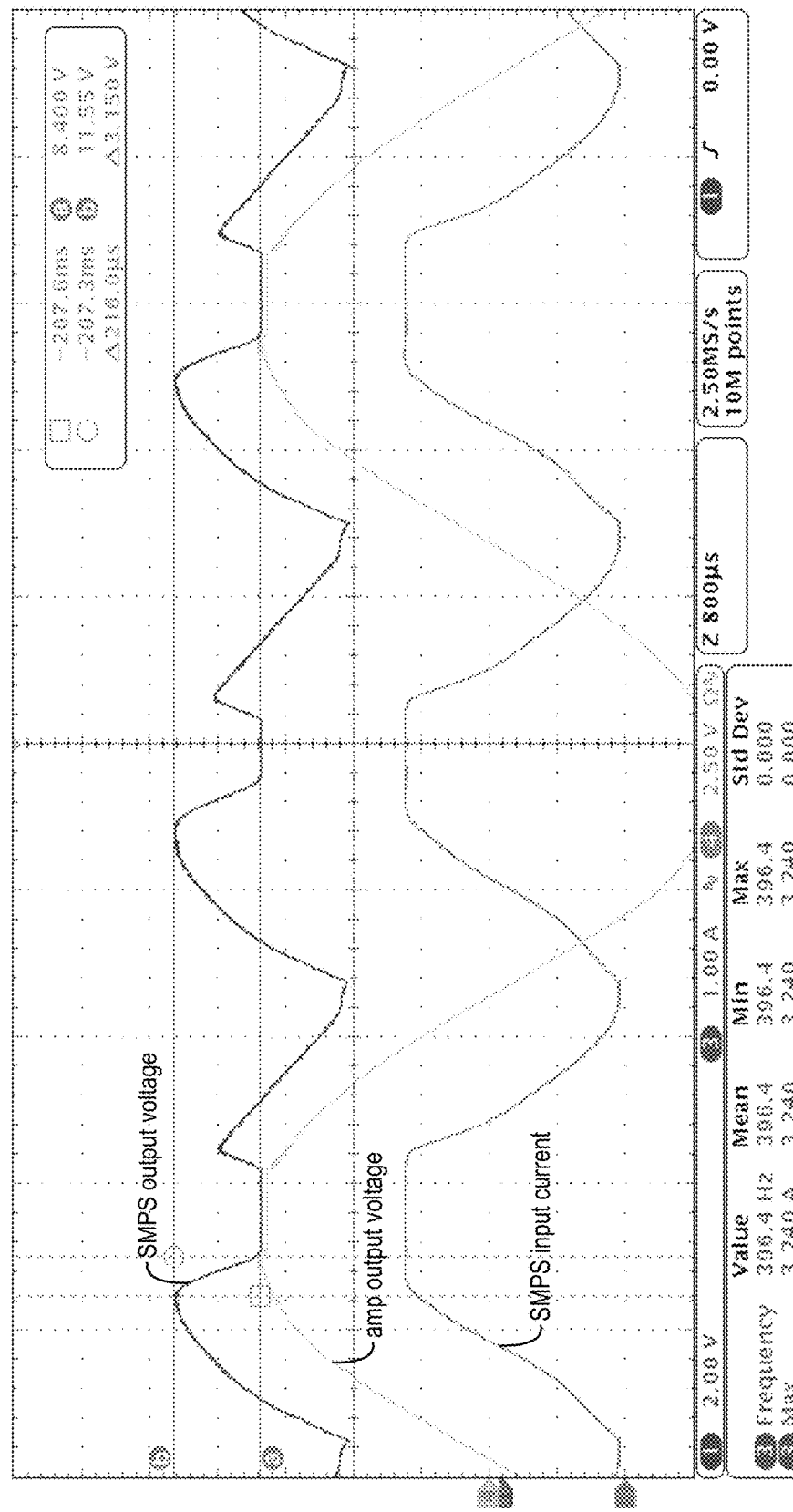

In FIG. 20, the same tone is played as in FIG. 19. However, the frequency-biased compressor 131 has been re-tuned to allow a small amount of clipping, as shown.

Figure 21:
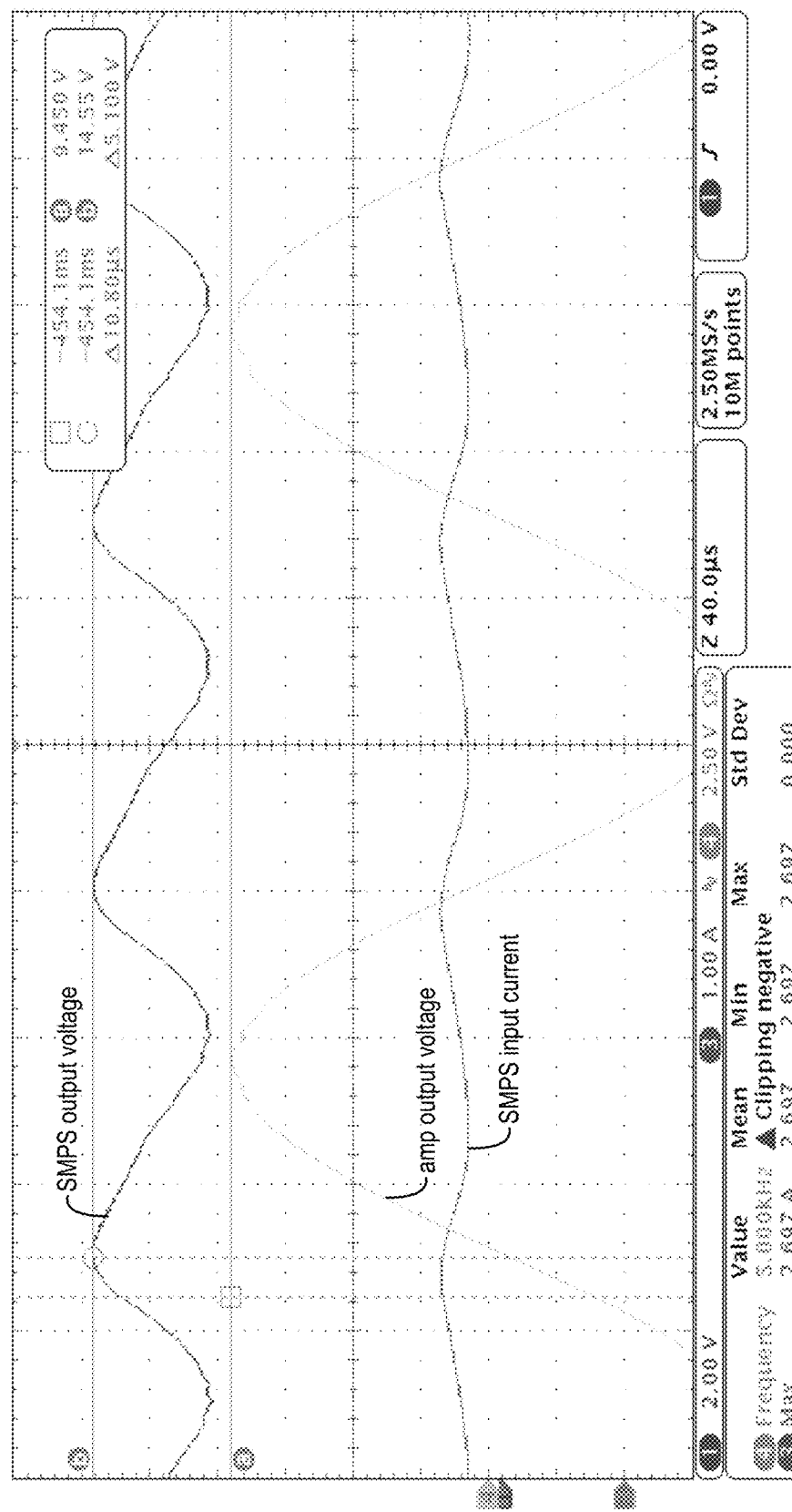

In FIG. 21, the same current limit is applied as in FIGS. 19 and 20, however a 5 kHz tone is played. The frequency-biased compressor 131 performs less compression on the high frequency audio output 114 to facilitate a high-volume amplifier 106 output signal without clipping.

It should be understood—especially by those having ordinary skill in the art with the benefit of this disclosure— that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. An audio system having an amplifier for driving an audio actuator, comprising:
   a switched-mode power supply that draws power from a power source to supply power to the amplifier;
   a capacitor that is charged by the switched-mode power supply to supply power to the amplifier; and
   a feed-forward compressor that performs dynamic range compression of an audio input to provide an audio output for amplification by the amplifier, wherein the compressor comprises:
      a sidechain frequency-biasing filter that generates a frequency-biased version of the audio input that is attenuated as frequency increases which causes the compressor to decrease the compression as frequency increases.

2. The audio system of claim 1, further comprising:
   a control block that limits a current drawn from the power source by the switched-mode power supply independent of frequency of the audio input.

3. The audio system of claim 2,
   wherein by causing the compressor to decrease the compression as frequency increases, the frequency-biasing filter enables the amplifier to use power supplied by the capacitor to use more power to amplify the audio output than the current limited switched-mode power supply can supply.

4. The audio system of claim 1,
   wherein by causing the compressor to decrease the compression as frequency increases, the frequency-biasing filter enables the amplifier to use power supplied by the capacitor to amplify high frequency transients in the audio output.

5. The audio system of claim 1,
wherein the amplifier is a Class D amplifier.

6. The audio system of claim 1, wherein the compressor sidechain further comprises:
a power detector that uses the frequency-biased version of the audio input received from the frequency-biasing filter to generate a frequency-biased power prediction of the audio input; and
a gain map that uses the frequency-biased power prediction to generate a gain applied to the audio input to accomplish the decreased compression as frequency increases.

7. The audio system of claim 6, further comprising:
a delay element in a main audio chain of the compressor that delays the audio input to generate a delayed audio input to which the gain is applied.

8. An audio device, comprising:
an audio actuator;
an amplifier for driving the audio actuator;
a switched-mode power supply that draws power from a power source to supply power to the amplifier;
a capacitor that is charged by the switched-mode power supply to supply power to the amplifier; and
a feed-forward compressor that performs dynamic range compression of an audio input to provide an audio output for amplification by the amplifier, wherein the compressor comprises:
a sidechain frequency-biasing filter that generates a frequency-biased version of the audio input that is attenuated as frequency increases which causes the compressor to decrease the compression as frequency increases.

9. The audio device of claim 8, further comprising:
a control block that limits a current drawn from the power source by the switched-mode power supply independent of frequency of the audio input.

10. The audio device of claim 9,
wherein by causing the compressor to decrease the compression as frequency increases, the frequency-biasing filter enables the amplifier to use power supplied by the capacitor to use more power to amplify the audio output than the current limited switched-mode power supply can supply.

11. The audio device of claim 8,
wherein by causing the compressor to decrease the compression as frequency increases, the frequency-biasing filter enables the amplifier to use power supplied by the capacitor to amplify high frequency transients in the audio output.

12. The audio device of claim 8,
wherein the amplifier is a Class D amplifier.

13. The audio device of claim 8, wherein the compressor sidechain further comprises:
a power detector that uses the frequency-biased version of the audio input received from the frequency-biasing filter to generate a frequency-biased power prediction of the audio input; and
a gain map that uses the frequency-biased power prediction to generate a gain applied to the audio input to accomplish the decreased compression as frequency increases.

14. The audio device of claim 13, further comprising:
a delay element in a main audio chain of the compressor that delays the audio input to generate a delayed audio input to which the gain is applied.

15. A method for use in an audio system having an amplifier for driving an audio actuator, comprising:
drawing, by a switched-mode power supply, power from a power source to supply power to the amplifier;
charging, by the switched-mode power supply, a capacitor to supply power to the amplifier; and
performing, by a feed-forward compressor, dynamic range compression of an audio input to provide an audio output for amplification by the amplifier, wherein said performing the compression comprises:
generating, by a sidechain frequency-biasing filter, a frequency-biased version of the audio input that is attenuated as frequency increases which causes the compressor to decrease the compression as frequency increases.

16. The method of claim 15, further comprising:
limiting, by a control block, a current drawn from the power source by the switched-mode power supply independent of frequency of the audio input.

17. The method of claim 16,
wherein by causing the compressor to decrease the compression as frequency increases, the frequency-biasing filter enables the amplifier to use power supplied by the capacitor to use more power to amplify the audio output than the current limited switched-mode power supply can supply.

18. The method of claim 15,
wherein by causing the compressor to decrease the compression as frequency increases, the frequency-biasing filter enables the amplifier to use power supplied by the capacitor to amplify high frequency transients in the audio output.

19. The method of claim 15, wherein the amplifier is a Class D amplifier.

20. The method of claim 15, further comprising:
using, by a power detector of the compressor sidechain, the frequency-biased version of the audio input received from the frequency-biasing filter to generate a frequency-biased power prediction of the audio input; and
using, by a gain map, the frequency-biased power prediction to generate a gain applied to the audio input to accomplish the decreased compression as frequency increases.

21. The method of claim 20, further comprising:
delaying, by a delay element in a main audio chain of the compressor, the audio input to generate a delayed audio input to which the gain is applied.

* * * * *